(12) United States Patent
Kohda et al.

(10) Patent No.: US 8,129,888 B2
(45) Date of Patent: Mar. 6, 2012

(54) SEALING MEMBER OF PIEZOELECTRIC RESONATOR DEVICE AND MANUFACTURING METHOD THEREFOR

(75) Inventors: Naoki Kohda, Kakogawa (JP); Hiroki Yoshioka, Kakogawa (JP); Syunsuke Satoh, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 0 days.

(21) Appl. No.: 12/680,921

(22) PCT Filed: Aug. 4, 2009

(86) PCT No.: PCT/JP2009/063803
§ 371 (c)(1),
(2), (4) Date: Mar. 31, 2010

(87) PCT Pub. No.: WO2010/016487
PCT Pub. Date: Feb. 11, 2010

(65) Prior Publication Data
US 2010/0270891 A1 Oct. 28, 2010

(30) Foreign Application Priority Data
Aug. 5, 2008 (JP) .................................. 2008-201882

(51) Int. Cl.
*H01L 41/08* (2006.01)
(52) U.S. Cl. ........................................ 310/344; 310/348
(58) Field of Classification Search .................. 310/344, 310/348
See application file for complete search history.

(56) References Cited

U.S. PATENT DOCUMENTS

| 7,528,523 | B2 * | 5/2009 | Aoki ......................... 310/313 R |
| 7,872,401 | B2 * | 1/2011 | Onitsuka et al. .............. 310/344 |
| 7,932,662 | B2 * | 4/2011 | Saito ............................ 310/344 |

FOREIGN PATENT DOCUMENTS

| JP | 07-154183 A | 6/1995 |
| JP | 2000-068780 A | 3/2000 |
| JP | 2002-198462 A | 7/2002 |
| JP | 2006-210829 A | 8/2006 |
| JP | 2006-295246 A | 10/2006 |
| JP | 2006-310779 A | 11/2006 |
| JP | 2007-292611 A | 11/2007 |

* cited by examiner

*Primary Examiner* — Mark Budd
(74) *Attorney, Agent, or Firm* — Marvin A. Motsenbocker; Mots Law, PLLC

(57) ABSTRACT

A sealing member of a piezoelectric resonator device is configured to hermetically seal a driving electrode formed on a piezoelectric resonator plate. In the sealing member, a through hole is formed so that an electrode pattern formed on both major surfaces of the substrate is brought into conduction; and a conductive member fills in the through hole. The through hole has a smaller diameter at a portion thereof inside the substrate than at both end portions thereof at the major surfaces of the sealing member. Both end faces of the conductive member have a concave shape with respect to the major surfaces of the substrate of the sealing member.

3 Claims, 14 Drawing Sheets

SEALING MEMBER OF PIEZOELECTRIC RESONATOR DEVICE AND MANUFACTURING METHOD THEREFOR

TECHNICAL FIELD

The present invention relates to a sealing member of a piezoelectric resonator device and a manufacturing method therefor.

BACKGROUND ART

The operating frequencies of a variety of electronic equipment have increased in recent years, and with such an increase in operating frequencies, piezoelectric resonator devices (e.g., crystal resonators or the like) are also required to take measures against such an increase in operating frequencies.

Piezoelectric resonator devices of such kinds include first and second sealing members of glass and a crystal resonator plate made of crystal and having driving electrodes formed on both major surfaces; the first sealing member and the second sealing member are laminated and bonded together via the crystal resonator plate so as to hermetically seal the driving electrodes of the crystal resonator plate located inside the sealing members (see Patent Document 1 described below, for example).

PRIOR ART DOCUMENT

Patent Document

[Patent Document 1] Japanese Patent No. 3390348

SUMMARY OF INVENTION

Problem to be Solved by the Invention

Now, in the case of using glass for the first sealing member and the second sealing member as disclosed in Patent Document 1, it is necessary to form a through hole, through which electrodes are routed between both major surfaces, in the first sealing member, for example.

For the formation of a through hole as described herein, a technique is used that etches a major surface of a substrate of the first sealing member perpendicularly to the direction along the thickness of the substrate; however, when a vertical columnar through hole is formed from the major surface of the substrate of the first sealing member, conduction in the through hole becomes unstable because the substrate of the first sealing member and a member that fills in the through hole are apt to be delaminated from each other due to the possible formation of voids caused by the high aspect ratio of the through hole when forming a plated layer in a through hole or due to the stress applied in the direction along the thickness of the substrate.

To solve the above-described problem, an object of the present invention is thus to provide a sealing member of a piezoelectric resonator device that provides stable conduction in a through hole formed in the sealing member, and a manufacturing method therefor.

Means for Solving the Problems

To accomplish the above-described object, the sealing member of a piezoelectric resonator device according to the present invention is a sealing member of a piezoelectric resonator device that hermetically seals a driving electrode formed on a piezoelectric resonator plate, in which a through hole is formed so that an electrode pattern formed on both major surfaces of a substrate of the sealing member is brought into conduction; and a conductive member fills in the through hole, the through hole having a smaller diameter at a portion thereof inside the substrate than at both end portions thereof at the major surfaces of the substrate, both end faces of the conductive member having a concave shape with respect to the major surfaces of the substrate.

According to the present invention, it is possible to provide stable conduction in the through hole formed in the sealing member. Specifically, according to the present invention, it is possible to reduce the aspect ratio of the through hole because the through hole is formed so that the electrode pattern formed on both major surfaces of the substrate is brought into conduction; and the conductive member fills in the through hole, the through hole having a smaller diameter at a portion thereof inside the substrate than at both end portions thereof at the major surfaces of the substrate, both end faces of the conductive member having a concave shape with respect to the major surfaces of the substrate. As a result, it is possible to prevent the formation of voids when forming the conductive member in the through hole. Also, since the through hole has a smaller diameter at a portion thereof inside the substrate than at both end portions thereof at the major surfaces of the substrate, an anchor effect occurs when bonding the conductive member into the through hole, which makes it possible to prevent the conductive member from being delaminated from the inside of the through hole. Moreover, according to the present invention, since the end faces of the conductive member have a concave shape with respect to the major surfaces of the substrate, it is possible to avoid a short circuit due to possible contact of the conductive member with any other member such as the piezoelectric resonator plate.

In the above-described configuration, an inner side face of the through hole may be tapered, and the through hole may have a smaller diameter at a midpoint thereof in the direction along a substrate thickness than at both end portions thereof at the major surfaces.

In this case, since the inner side face of the through hole is tapered and the through hole has a smaller diameter at a midpoint thereof in the direction along the substrate thickness than at both end portions thereof at the major surfaces, an anchor effect is more likely to occur when bonding the conductive material into the through hole.

In the above-described configuration, the conductive member may be a compound that contains at least Au and Sn, and Au is unevenly distributed in an area of the through hole inside the substrate where the through hole has a small diameter.

In this case, such uneven distribution of Au in the area of the through hole, where the through hole has a narrow diameter, provides good conduction in the through hole.

To attain the above-described object, another sealing member of a piezoelectric resonator device according to the present invention is a sealing member of a piezoelectric resonator device that hermetically seals a driving electrode formed on a piezoelectric resonator plate, in which a through hole is formed so that an electrode pattern formed on both major surfaces of a substrate of the sealing member is brought into conduction; and a conductive member fills in the through hole, the through hole having a smaller diameter at one end face thereof than at the other end face thereof, the one and the other end faces at the major surfaces of the substrate, both end faces of the conductive member having a concave shape with respect to the major surfaces of the substrate.

According to the present invention, it is possible to provide stable conduction in the through hole formed in the sealing member. Specifically, according to the present invention, it is possible to reduce the aspect ratio of the through hole because the through hole is formed so that the electrode pattern formed on both major surfaces of the substrate is brought into conduction; and the conductive member fills in the through hole, the through hole having a smaller diameter at one end face thereof than at the other end face thereof at the major surfaces of the substrate, both end faces of the conductive member having a concave shape with respect to the major surfaces of the substrate. As a result, it is possible to prevent the formation of voids when forming the conductive member in the through hole. Also, since the through hole has a smaller diameter at one end face thereof than at the other end face thereof at the major surfaces of the substrate, an anchor effect occurs when bonding the conductive member into the through hole, which makes it possible to prevent the conductive member from being delaminated from the inside of the through hole. Moreover, according to the present invention, since the end faces of the conductive member have a concave shape with respect to the major surfaces of the sealing member, it is possible to avoid a short circuit due to possible contact of the conductive member with any other member such as the piezoelectric resonator plate.

In the above-described configuration, an inner side face of the through hole may be tapered and tilted at an angle of approximately 45 to 85 degrees relative to a major surface of the substrate.

This case is preferable to provide stable conduction in the through hole formed in the sealing member.

In the above-described configuration, the electrode pattern may include a diffusion preventing layer that prevents metal from diffusing. A specific example of the diffusion preventing layer is a Ni-plated layer. The diffusion preventing layer may also be a layer (film) of a material, such as Mo, W, or Ti, other than a Ni-plated layer. Efficient film formation is possible with a technique such as sputtering used as a method for forming the diffusion preventing layer. As a specific example, the diffusion preventing layer may preferably have a film thickness of approximately 0.1 to 0.5 μm. Also, if a material that has nearly the same thermal expansion coefficient as a glass material is selected as a substrate of the sealing member, this contributes to an improvement in the reliability of the diffusion preventing layer after film formation.

In this case, even if self annealing of the conductive member is caused by any change with time or any thermal change, the presence of the diffusion preventing layer can prevent the conductive member from diffusing into the electrode pattern.

To attain the above-described object, a method for manufacturing a sealing member of a piezoelectric resonator device according to the present invention is a method for manufacturing a sealing member of a piezoelectric resonator device that hermetically seals a driving electrode formed on a piezoelectric resonator plate. The method includes a formation step of forming a through hole so that an electrode pattern formed on both major surfaces of a substrate of the sealing member is brought into conduction; and a filling step of filling the through hole with a conductive member, wherein, in the formation step, a through hole is formed by etching the substrate from the major surfaces of the substrate, using an etching technique, so that the through hole has a smaller diameter at a portion thereof inside the substrate than at both end portions thereof at the major surfaces; and both end faces of the conductive member have a concave shape with respect to the major surfaces of the substrate.

According to the present invention, it is possible to provide stable conduction in the through hole formed in the sealing member. Specifically, according to the present invention, it is possible to reduce the aspect ratio of the through hole because the method includes a formation step and a filling step, wherein, in the formation step, a through hole is formed by etching the substrate from both of the major surfaces of the substrate, using an etching technique, so that the through hole has a smaller diameter at a portion thereof inside the substrate than at both end portions thereof at the major surfaces, and both end faces of the conductive member have a concave shape with respect to the major surfaces of the substrate. As a result, it is possible to prevent the formation of voids when forming the conductive member in the through hole. Moreover, since the through hole has a smaller diameter at a portion thereof inside the substrate than at both end portions thereof at the major surfaces, an anchor effect occurs when bonding conductive member into the through hole, which makes it possible to prevent the conductive member from being delaminated from the inside of the through hole. Moreover, since the through hole has a smaller diameter at a portion thereof inside the substrate than at both end portions thereof at the major surfaces, an anchor effect occurs when bonding the conductive member into the through hole, which makes it possible to prevent the conductive member from being delaminated from the inside of the through hole.

In the above-described method, the filling step may be such that an Au layer is formed in the through hole, an Sn layer is formed on the Au layer, and the Au layer and the Sn layer formed in the through hole are heated and melted at a temperature that is equal to or higher than a eutectic point.

In this case, since, in the filling step, the Au layer is formed in the through hole, the Sn layer is formed on the Au layer, and the Au layer and the Sn layer are heated and melted at a temperature that is equal to or higher than a eutectic point, it is possible to prevent the formation of voids in the conductive member in the step of filling with the conductive member.

In the above-described method, the filling step may be such that an Au—Sn alloy plated layer is formed in the through hole and the Au—Sn alloy plated layer is heated and melted at a temperature that is equal to or higher than a eutectic point.

In this case, since, in the filling step, the Au—Sn alloy plated layer is formed in the through hole and the Au—Sn alloy plated layer is heated and melted at a temperature that is equal to or higher than a eutectic point, it is possible to prevent the formation of voids in the conductive member in the step of filling with the conductive member. In addition, if the conductive member is formed from the Au—Sn alloy plated layer, the melting time is short because an alloy is already there (before the formation of the conductive member).

Effects of the Invention

With the sealing member of a piezoelectric resonator device and a manufacturing method therefor according to the present invention, it is possible to provide stable conduction in a through hole formed in the sealing member.

Figure 1:
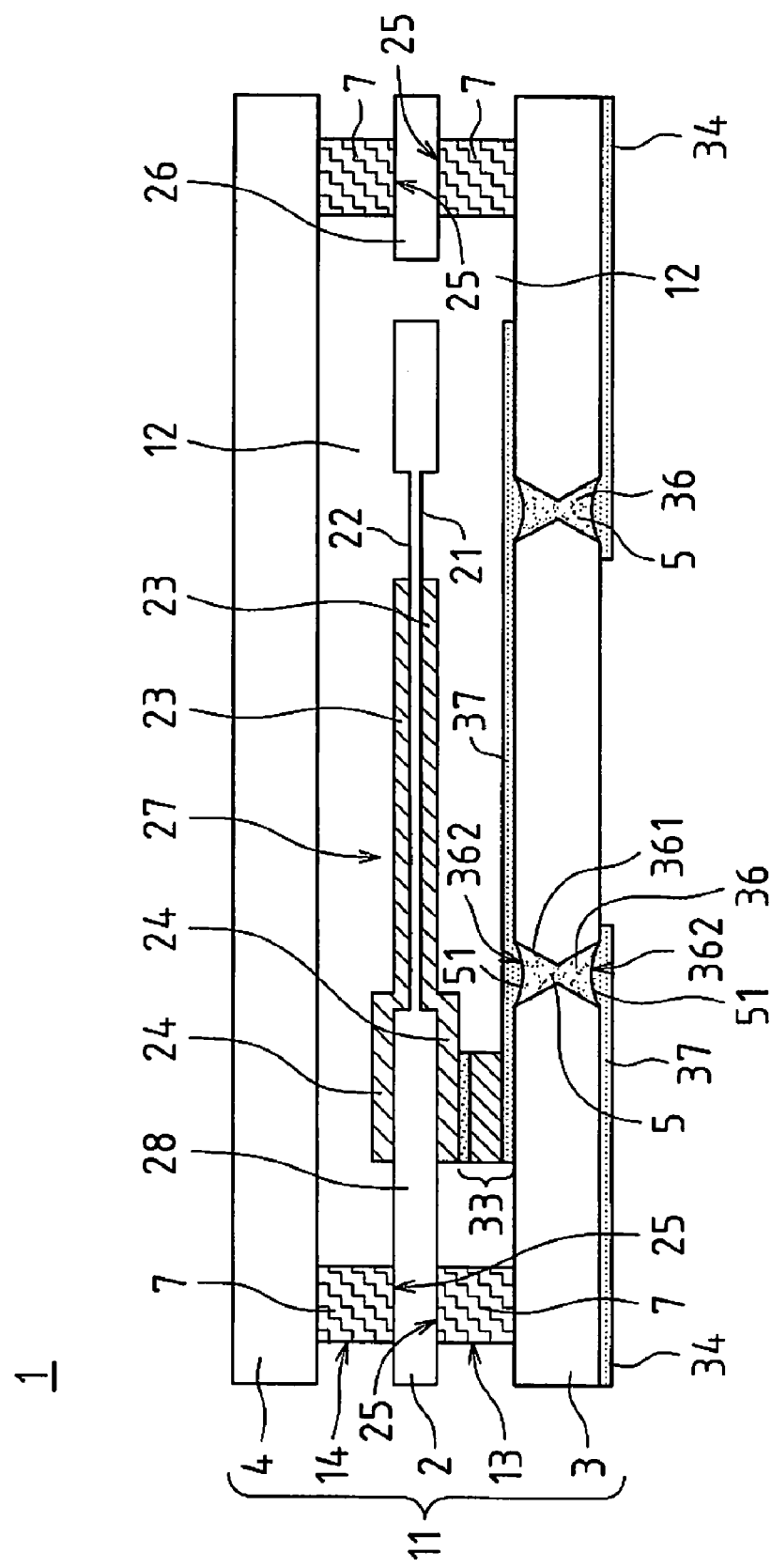
FIG. 1 is a schematic side view showing an internal space of a crystal resonator according to an embodiment of the present invention.

DESCRIPTION OF REFERENCE NUMERALS 1 crystal resonator (piezoelectric resonator device)
12 internal space
2 crystal resonator plate (piezoelectric resonator plate)
23 driving electrodes
3 first sealing member
31 one major surface of first sealing member
32 bonding surface of first sealing member
33 electrode pad (part of electrode pattern)
34 external electrode terminal (part of electrode pattern)
35 inside of substrate of first sealing member
36 via (through hole)
361 inner side face of via
362 end portions of via
363 one end face of via
364 other end face of via
37 electrode pattern (part of electrode pattern)
38 other major surface of first sealing member
39 midpoint of first sealing member
4 second sealing member
5 conductive member
51 end faces of conductive member
52 intermetallic compound of Au and Sn
53 Au
54 Au film
55 Au-plated layer
56 Sn-plated layer
6 wafer of quartz crystal Z plate
61, 62 major surfaces of wafer of quartz crystal Z plate
7 bonding material 81 Au protective film layer
82 positive resist layer

MODE FOR CARRYING OUT THE INVENTION

Embodiments of the present invention are described below with reference to the drawings. Note that the following embodiments describe the case where the present invention is applied to a crystal resonator serving as a piezoelectric resonator device that generates piezoelectric resonators.

A crystal resonator 1 according to an embodiment of the present invention includes, as illustrated in FIG. 1, a crystal resonator plate 2 (a crystal resonator plate according to the present invention), a first sealing member 3 (a sealing member according to the present invention) that hermetically seals a driving electrode 23 (see below) formed on one major surface 21 of the crystal resonator plate 2, and a second sealing member 4 that hermetically seals another driving electrode 23 (see below) formed on the other major surface 22 of the crystal resonator plate 2.

This crystal resonator 1 is configured into a package 11 by bonding the crystal resonator plate 2 and the first sealing member 3 together with a bonding material 7 and by bonding the crystal resonator plate 2 and the second sealing member 4 together with another bonding material 7. With the first sealing member 3 and the second sealing member 4 being bonded together via the crystal resonator plate 2, the package 11 contains two internal spaces 12, and the driving electrodes 23 formed on the major surfaces 21 and 22 of the crystal resonator plate 2 are hermetically sealed in the respective internal spaces 12 of the package 11.

Components of the above-described crystal resonator 1 are described next with reference to FIG. 2. Note that the description herein is given for each member, namely the crystal resonator plate 2, the first sealing member 3, and the second sealing member 4, which are not bonded together and each of which is configured as an independent unit.

The crystal resonator plate 2 is made of crystal that is a piezoelectric material and its major surfaces 21 and 22 are both formed in an inverted-mesa shape. Then, the driving electrodes 23 are formed on thin-walled portions of the major surfaces 21 and 22 of an inverted-mesa shape, and lead electrodes 24 are led from those driving electrodes 23. Note that the lead electrodes 24 are electrically connected to an electrode pad 33 formed on the first sealing member 3.

In the crystal resonator plate 2, peripheral end portions 26 of the major surfaces 21 and 22, as viewed in plane, form bonding surfaces 25 where the first sealing member 3 and the second sealing member 4 are bonded together, whereas central portions of the major surfaces 21 and 22, as viewed in plane, form a resonator region 27. The resonator region 27 is connected to the bonding surfaces 25 via a portion 28 (in the vicinity of one side portion in a longitudinal direction).

The bonding surface 25 of one major surface 21 of the crystal resonator plate 2 has formed thereon a first bonding material 71 for bonding the first sealing member 3. The bonding surface 25 of the other major surface 22 of the crystal resonator plate 2 has formed thereon a second bonding material 72 for bonding the second sealing member 4.

The first bonding material 71 and the second bonding material 72 have the same configuration. The first bonding material 71 and the second bonding material 72 are configured by laminating multiple layers on the bonding surfaces 25 of the peripheral end portions 26 of the major surfaces 21 and 22, as viewed in plane; when viewed from the bottom layer side, forming a Cr layer (not shown) and an Au layer (not shown) by evaporation and laminating thereon Au-plated layers 711 and 721. In the present embodiment, the Cr layer has a thickness of 0.05 μm and the Au layer has a thickness of 0.15 μm.

Figure 2:
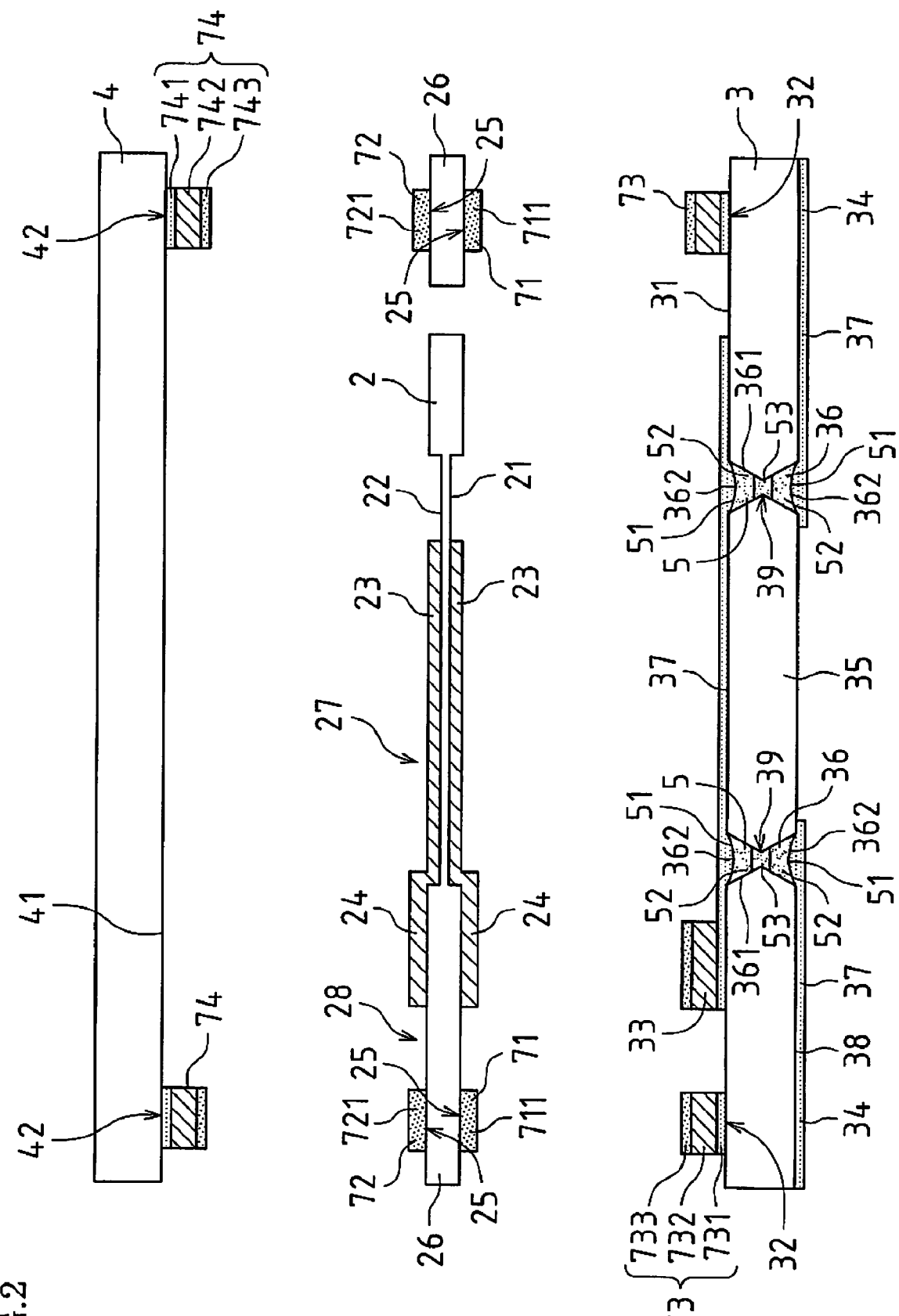
FIG. 2 is a schematic block diagram illustrating components of a crystal resonator according to an embodiment of the present invention.

The first sealing member 3 is, as illustrated in FIG. 2, a quartz crystal Z plate of a rectangular parallelepiped shape formed from a single crystal wafer 6 (see below).

The first sealing member 3 includes the electrode pad 33 that is electrically connected to the driving electrode 23 of the crystal resonator plate 2, a bonding portion that is bonded to the crystal resonator plate 2 (specifically, a bonding surface 32), and an external electrode terminal 34 that is electrically connected to the outside. The bonding surface 32 bonded to the crystal resonator plate 2 is provided on the outer periphery of one major surface 31 of the first sealing member 3 as viewed in plane.

The bonding surface 32 of the first sealing member 3 has formed thereon a third bonding material 73 for bonding the crystal resonator plate 2. Specifically, the third bonding material 73 is configured by laminating multiple layers; when viewed from the bottom layer side, forming a Cr layer (not shown) and an Au layer 731 by evaporation, laminating thereon a Sn-plated layer 732, and then laminating thereon an Au-plated layer 733. Note that the third bonding material 73 and the electrode pad 33 are formed at the same time so that the electrode pad 33 has the same configuration as the third bonding material 73.

The first sealing member 3 also has, as illustrated in FIG. 2, a via 36 (a through hole according to the present invention) formed therein so that the driving electrodes 23 of the crystal resonator plate 2 are brought into conduction with the outside, and this via 36 is filled with a conductive member 5 (see below). In other words, the via 36 is configured so that an electrode pattern (the electrode pad 33, the external electrode terminal 34, and the electrode pattern 37) formed on the major surfaces 31 and 38 of the substrate of the first sealing member 3 is brought into conduction. Through the via 36, the electrode pattern 37 is patterned from the electrode pad 33 on one major surface 31 of the first sealing member 3 to the external electrode terminal 34 on the other major surface 38.

Also, as illustrated in FIG. 2, an inner side face 361 of the via 36 is tapered so that the via 36 has a smaller diameter at a portion thereof in an interior 35 of the substrate than at both end portions 362 thereof at the major surfaces 31 and 38. Specifically, the via 36 has a narrow diameter at a midpoint 39 in the direction along the thickness of the first sealing member 3. In the present embodiment, the via 36 has a maximum diameter at both end portions 362 thereof at the major surfaces 31 and 38 of the first sealing member 3 and has a minimum diameter at a portion thereof in the interior 35 of the substrate of the first sealing member 3. Then, the via 36 is filled with the conductive member 5 that includes at least an Au—Sn alloy by means of diffusion bonding of at least Au and Sn through a below-described method of manufacturing the first sealing member 3.

Note that both end faces 51 of the conductive member 5 have a concave shape with respect to the major surfaces 31 and 38 of the first sealing member 3. Specifically, the end faces 51 of the conductive member 5 are made concave by the Au and Sn thereof being melted and diffused so as to be drawn in the direction along the plane of the major surfaces 31 and 38. Such drawing of Au and Sn provides good bonding between the first sealing member 3 and the conductive member 5 and prevents the formation of a clearance between the first sealing member 3 and the conductive member 5, thus preventing the leakage of filler, i.e., the conductive member 5 into the first sealing member 3.

The conductive member 5 is also configured to provide stable conduction, with the Au thereof being unevenly distributed in an area of the via 36 in the interior 35 of the substrate where the via 36 has a narrow diameter. In other words, the conductive member 5 is configured to stable conduction, with the Au thereof unevenly distributed at the midpoint 39 in the direction along the thickness of the first sealing member 3, where the via 36 has a narrow diameter. Specifically, the conductive member 5 according to the present embodiment is an Au-rich Au—Sn compound that contains an Au—Sn intermetallic compound 52 that is located in the via 36 in the vicinity of the major surfaces 31 and 38 of the first sealing member 3; and Au 53 that is located at the midpoint 39 in the direction along the thickness of the first sealing member 3.

The second sealing member 4 is, as illustrated in FIG. 2, a quartz crystal Z plate of a rectangular parallelepiped shape formed from a single crystal wafer.

The second sealing member 4 includes a bonding portion (specifically, a bonding surface 42) that is bonded to the crystal resonator plate 2. The bonding surface 42 is provided on the outer periphery of one major surface 41 of the second sealing member 4 as viewed in plane.

The bonding surface 42 of the second sealing member 4 has formed thereon a fourth bonding material 74 for bonding the crystal resonator plate 2. Specifically, the fourth bonding material 74 is configured by laminating multiple layers; when viewed from the bottom layer side, forming a Cr layer (not shown) and an Au layer 741 by evaporation, laminating thereon a Sn-plated layer 742, and then laminating thereon an Au-plated layer 743.

Note that a bonding region (specifically, a sealed path) of the first bonding material 71 on the bonding surface 25 of the above-described crystal resonator plate 2 and a bonding region (specifically, a sealed path) of the third bonding material 73 on the bonding surface 32 of the above-described first sealing member 3 have the same width. It is also noted that a bonding region (specifically, a sealed path) of the second bonding material 72 on the bonding surface 25 of the crystal resonator plate 2 and a bonding region (specifically, a sealed path) of the fourth bonding material 74 on the bonding surface 42 of the second sealing member 4 have the same width.

A method for manufacturing the crystal resonator 1 and the first sealing member 3 is described next with reference to the drawings.

Figure 3:
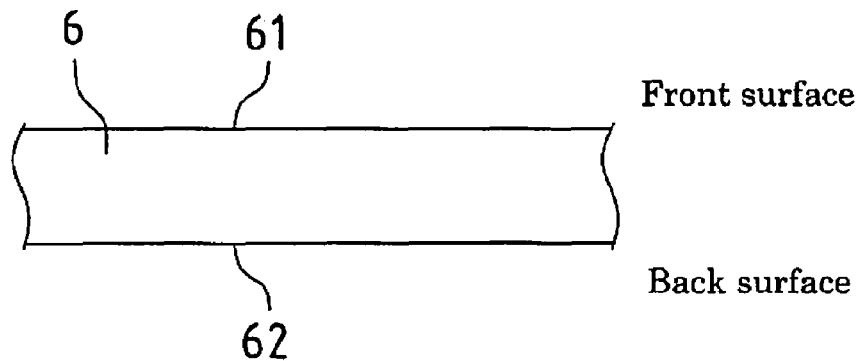
FIG. 3 is a schematic process drawing showing a step of wafer cleaning in the process of manufacturing a first sealing member according to an embodiment of the present invention.

Both major surfaces 61 and 62 of a wafer 6 of a quartz crystal Z plate, from which multiple first sealing members 3 are formed, are cleaned (see FIG. 3).

Figure 4:
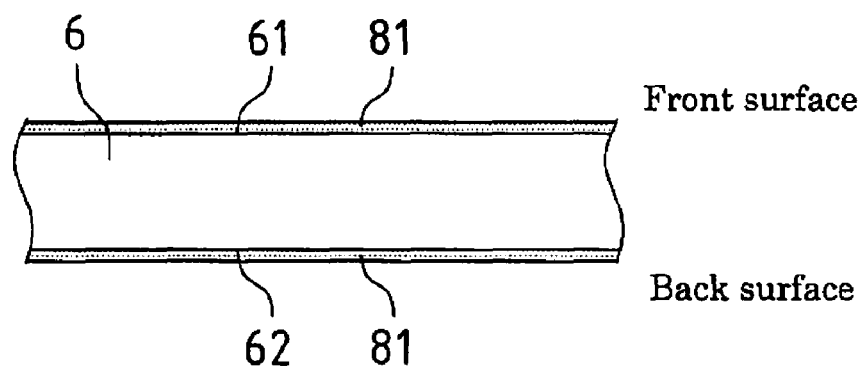
FIG. 4 is a schematic process drawing showing a step of forming an Au protective layer in the process of manufacturing a first sealing member according to an embodiment of the present invention.

After the cleaning of the wafer 6, an Au protective film layer 81 with a Cr layer (not shown) as a primary coating is formed by evaporation on the major surfaces 61 and 62 as illustrated in FIG. 4.

Figure 5:
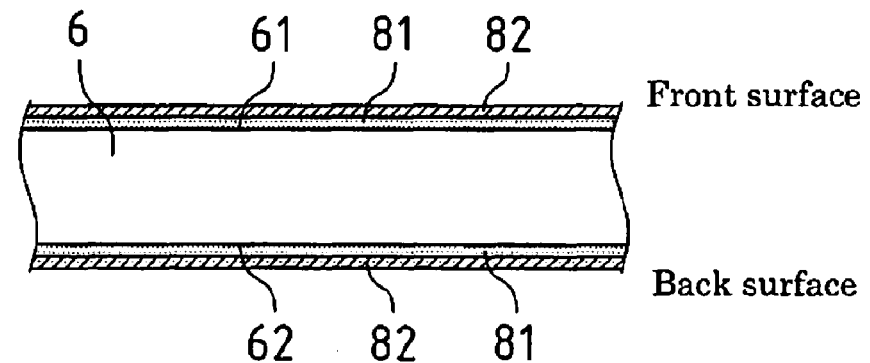
FIG. 5 is a schematic process drawing showing a step of resist coating in the process of manufacturing a first sealing member according to an embodiment of the present invention.

After the Au protective film layer 81 has been formed on the major surfaces 61 and 62 of the wafer 6, a resist is applied by spin coating on the Au protective film layer 81 so as to form a positive resist layer 82 as illustrated in FIG. 5.

Figure 6:
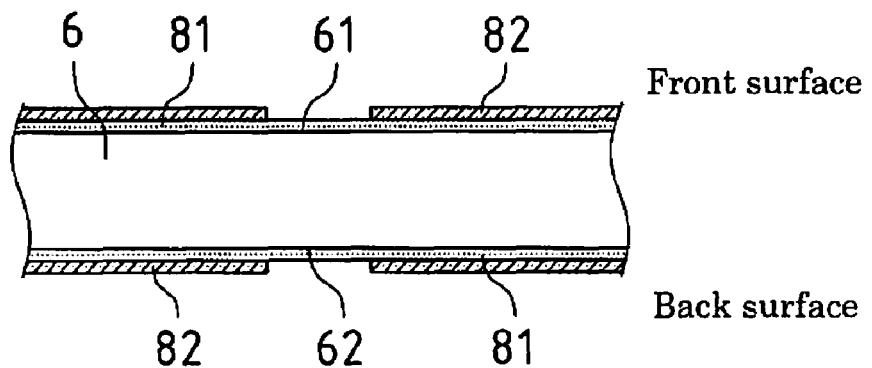
FIG. 6 is a schematic process drawing showing a step of exposure and development in the process of manufacturing a first sealing member according to an embodiment of the present invention.

After the positive resist layer 82 has been formed on the Au protective film layer 81, exposure and development are performed so as to form a preset pattern (a via 36) as illustrated in FIG. 6.

Figure 7:
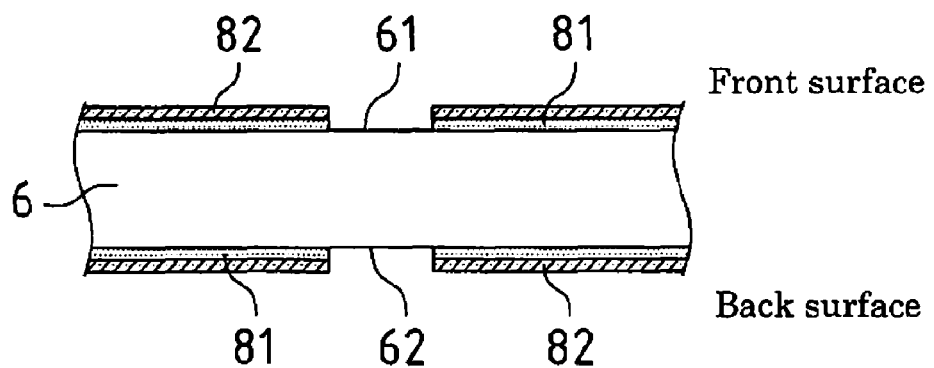
FIG. 7 is a schematic process drawing showing a step of metal etching in the process of manufacturing a first sealing member according to an embodiment of the present invention.
Figure 8:
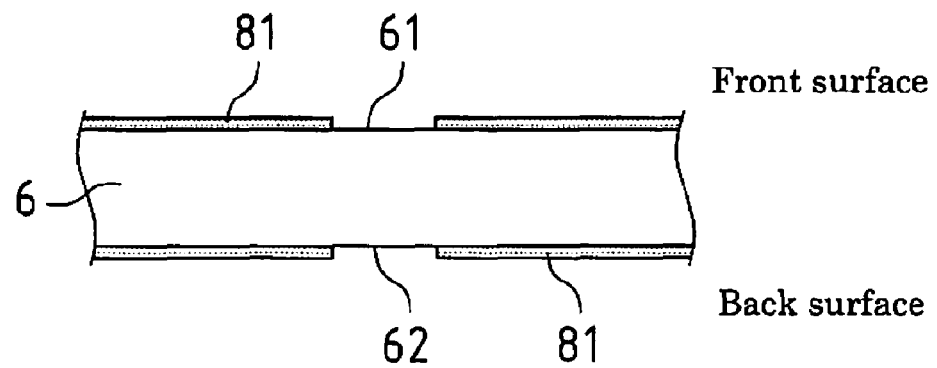
FIG. 8 is a schematic process drawing showing a step of resist delamination in the process of manufacturing a first sealing member according to an embodiment of the present invention.

The Au protective film layer 81 that has been exposed by the exposure and development is then subjected to metal etching (see FIG. 7) and thereafter the positive resist layer 82 is delaminated and removed (see FIG. 8).

Figure 9:
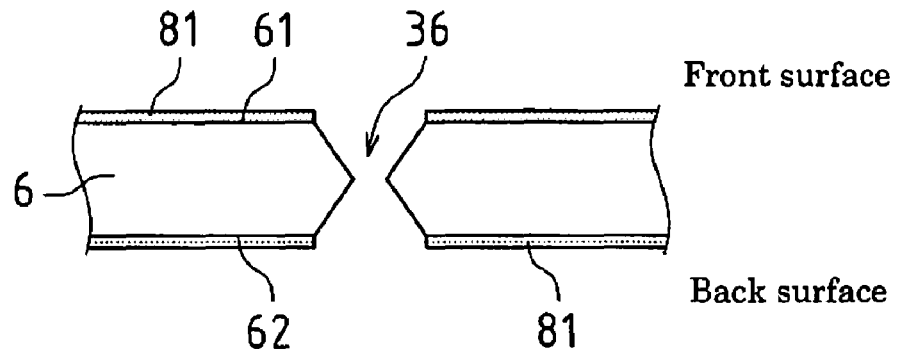
FIG. 9 is a schematic process drawing showing a step of via etching in the process of manufacturing a first sealing member according to an embodiment of the present invention.

After the positive resist layer 82 has been removed as illustrated in FIG. 8, a via 36 is formed by wet etching (see FIG. 9).

Figure 10:
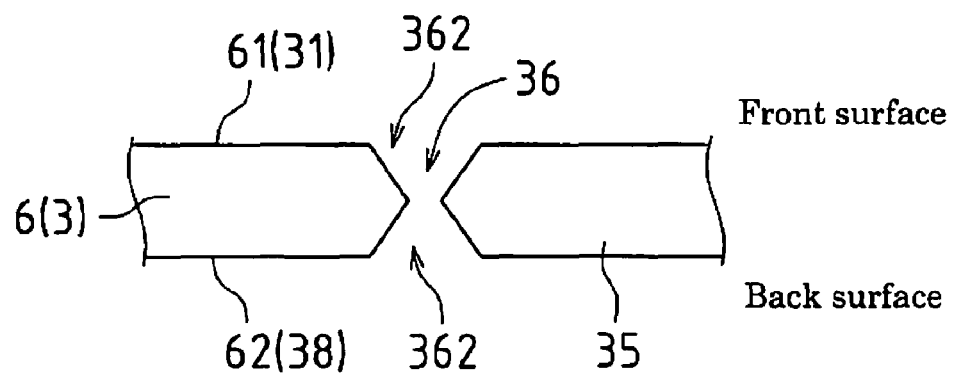
FIG. 10 is a schematic process drawing showing a step of metal etching in the process of manufacturing a first sealing member according to an embodiment of the present invention.

After the formation of the via 36, the Au protective film layer 81 is removed by metal etching as illustrated in FIG. 10.

The above-described steps are referred to as a formation step according to the present invention, i.e., the step of forming a via 36 so that an electrode pattern (the electrode pad 33, the external electrode terminal 34, and the electrode pattern 37) formed on the major surfaces 31 and 38 of the substrate of the first sealing member 3 is brought into conduction.

In the above-described formation step, the via 36 is formed by etching the substrate simultaneously from both of the major surfaces 31 and 38 of the substrate of the first sealing member 3, using an etching technique (wet-etching in the present embodiment), so that a via 36 has a smaller diameter at a portion thereof in the interior 35 of the substrate than at both end portions 362 thereof at the major surfaces 31 and 38.

Figure 11:
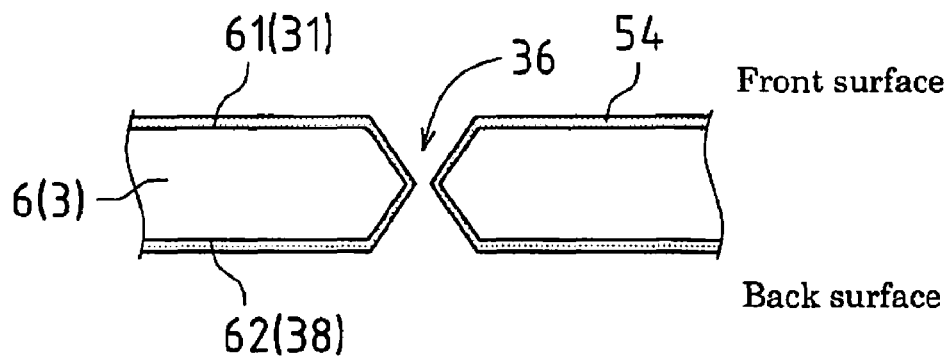
FIG. 11 is a schematic process drawing showing a step of forming an Au film in the process of manufacturing a first sealing member according to an embodiment of the present invention.

After the Au protective film layer 81 has been removed, an Au film 54 using a plated wiring Cr film (not shown) as a primary coating is formed by evaporation on the surface of the wafer 6 including the via 36 as illustrated in FIG. 11.

Figure 12:
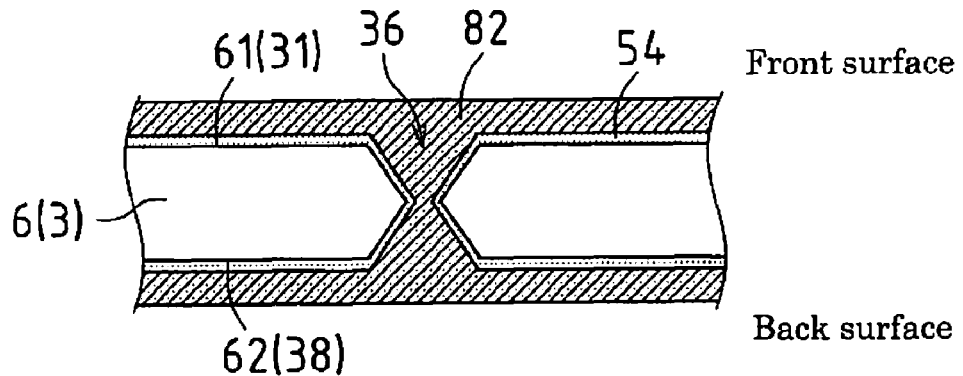
FIG. 12 is a schematic process drawing showing a step of resist coating in the process of manufacturing a first sealing member according to an embodiment of the present invention.

After the Au film 54 has been formed on the surface of the wafer 6, a resist is applied by dip coating the entire surface of the wafer 6 so as to form a positive resist layer 82 (see FIG. 12).

Figure 13:
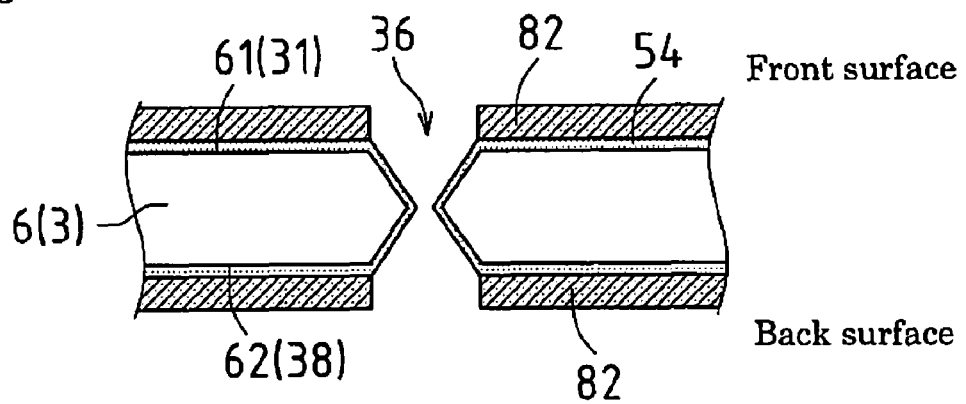
FIG. 13 is a schematic process drawing showing a step of exposure and development in the process of manufacturing a first sealing member according to an embodiment of the present invention.

After the positive resist layer 82 has been formed on the Au film 54, exposure and development are performed so as to form a preset pattern (formation of plating on the via 36) as illustrated in FIG. 13.

Figure 14:
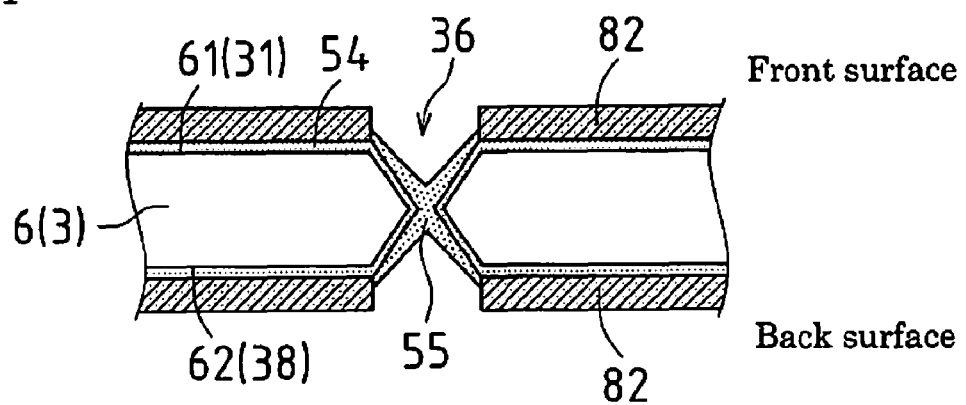
FIG. 14 is a schematic process drawing showing a step of forming an Au-plated layer in the process of manufacturing a first sealing member according to an embodiment of the present invention.

An Au-plated layer 55 (an Au layer according to the present invention) is formed in the via 36 on the Au film 54 that has been exposed by the exposure and development (see FIG. 14). Note that, at this time, the Au-plated layer 55 is formed in only the via 36.

Figure 15:
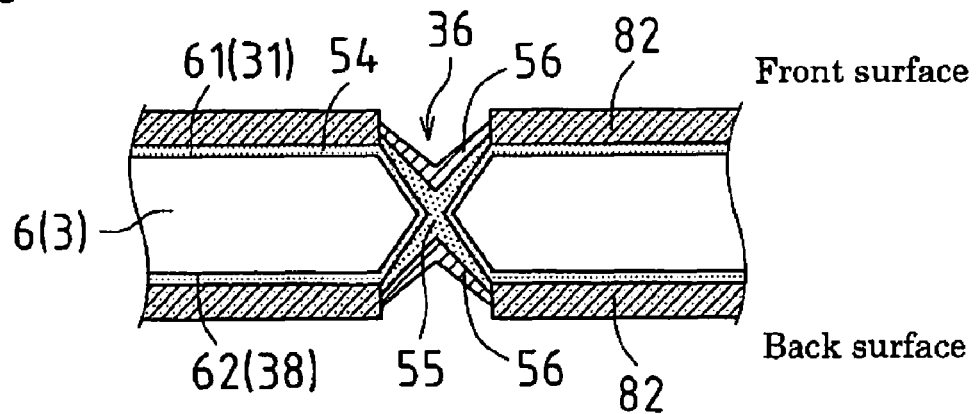
FIG. 15 is a schematic process drawing showing a step of forming an Sn-plated layer in the process of manufacturing a first sealing member according to an embodiment of the present invention.

After the Au-plated layer 55 has been formed on the Au film 54 in the via 36, an Sn-plated layer 56 (an Sn layer according to the present invention) is formed on the Au-plated layer 55 as illustrated in FIG. 15.

Figure 16:
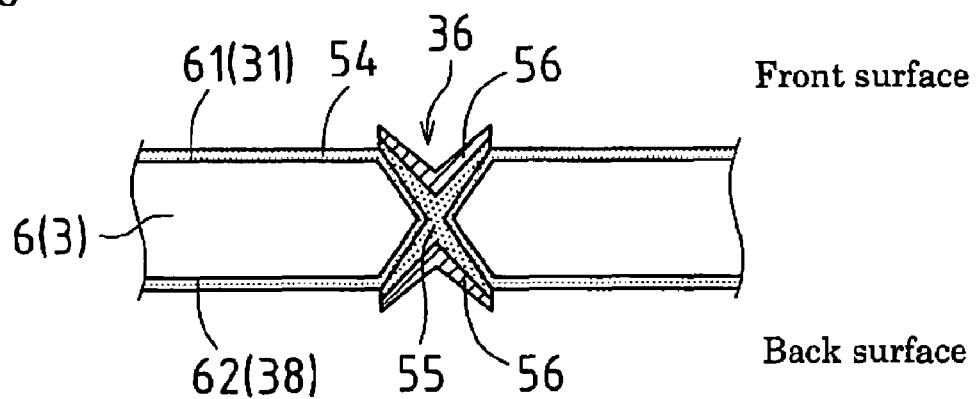
FIG. 16 is a schematic process drawing showing a step of resist delamination in the process of manufacturing a first sealing member according to an embodiment of the present invention.

After the Sn-plated layer 56 has been formed on the Au-plated layer 55, the positive resist layer 82 is delaminated and removed so as to expose the Au film 54 formed on the major surfaces 61 and 62 of the wafer 6 (see FIG. 16).

Figure 17:
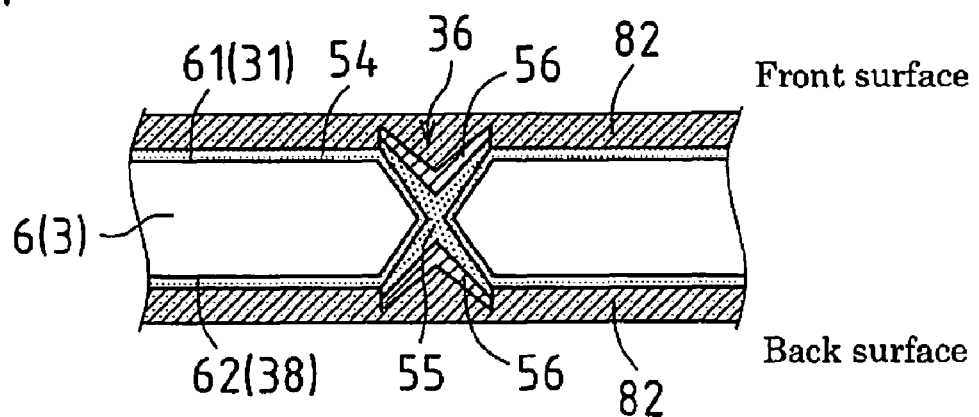
FIG. 17 is a schematic process drawing showing a step of resist coating in the process of manufacturing a first sealing member according to an embodiment of the present invention.

After the Au film 54 formed on the major surfaces 61 and 62 of the wafer 6 have been exposed, a resist is applied again by dip coating the entire surface of the wafer 6 including the via 36 so as to form a positive resist layer 82 (see FIG. 17).

Figure 18:
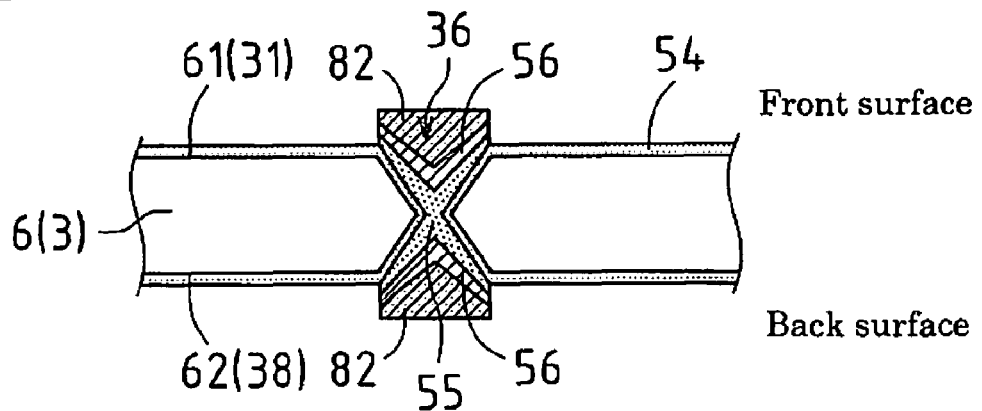
FIG. 18 is a schematic process drawing showing a step of exposure and development in the process of manufacturing a first sealing member according to an embodiment of the present invention.

After the positive resist layer 82 has been formed on the entire surface of the wafer 6, exposure and development are performed so as to expose the Au film 54 formed on the major surfaces 61 and 62 of the wafer 6, except that on the via 36, as illustrated in FIG. 18.

Figure 19:
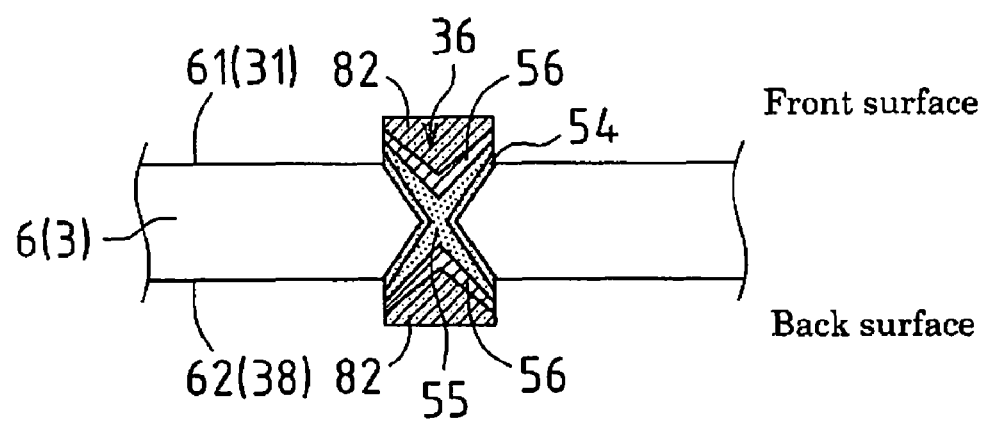
FIG. 19 is a schematic process drawing showing a step of metal etching in the process of manufacturing a first sealing member according to an embodiment of the present invention.

After the Au film 54 formed on the major surfaces 61 and 62 of the wafer 6 has been exposed, the Au film 54 is subjected to metal etching so as to expose the major surfaces 61 and 62 of the wafer 6 as illustrated in FIG. 19. Note that, at this time, only the Au film 54 formed on the via 36 remains on the wafer 6.

Figure 20:
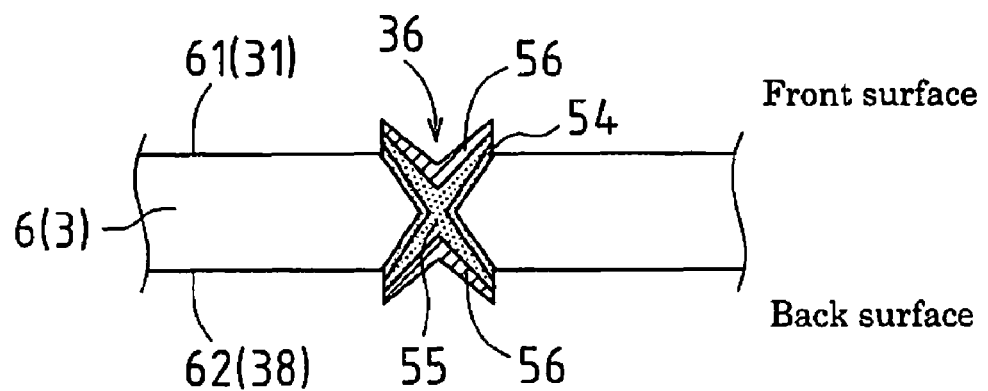
FIG. 20 is a schematic process drawing showing a step of metal etching in the process of manufacturing a first sealing member according to an embodiment of the present invention.

After the major surfaces 61 and 62 of the wafer 6 have been exposed, the positive resist layer 82 formed on the via 36 is delaminated and removed as illustrated in FIG. 20.

Figure 21:
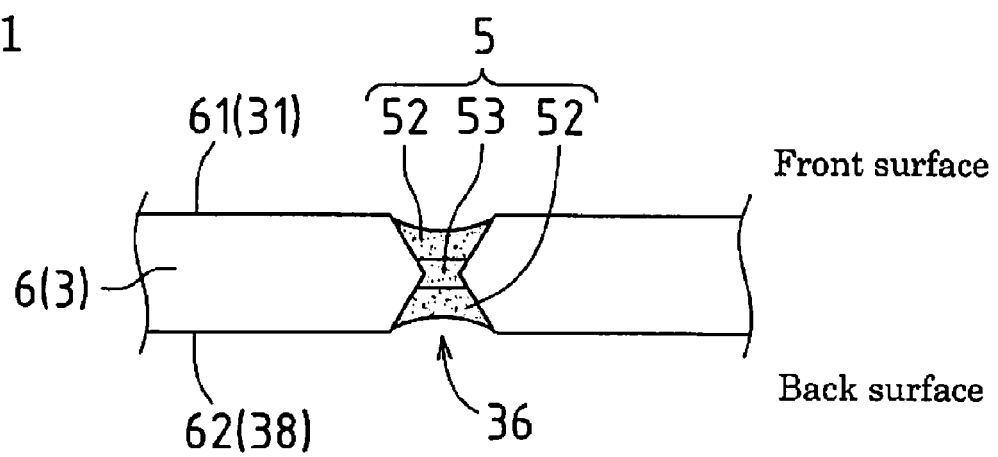
FIG. 21 is a schematic process drawing showing a step of melting an Au-plated layer and a Sn-plated layer in the process of manufacturing a first sealing member according to an embodiment of the present invention.
Figure 22:
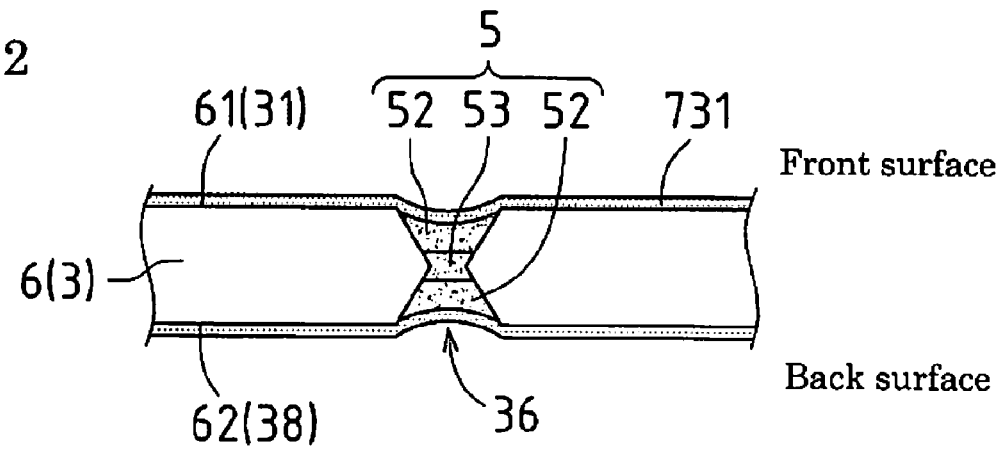
FIG. 22 is a schematic process drawing showing a step of forming an Au film in the process of manufacturing a first sealing member according to an embodiment of the present invention.

After the positive resist layer 82 formed on the via 36 has been delaminated and removed, the Au-plated layer 55 and the Sn-plated layer 56 formed in the via 36 are heated and melted so as to form a conductive member 5 that includes an Au-rich Au—Sn compound that contains an intermetallic compound 52 of Au and Sn located in the via 36 in the vicinity of the major surfaces 31 and 38 of the first sealing member 3 and Au 53 located at the midpoint 39 in the direction along the thickness of the first sealing member 3 (see FIG. 21) and an Au film (as a specific example, an Au film 731 of the third bonding material 73) is formed thereafter by evaporation on the entire surface of the wafer 6 (see FIG. 22).

The above-described steps are referred to as a filling step according to the present invention, i.e., the step of filling the via 36 with the conductive member 5.

In the above-described filling step, the Au-plated layer 55 is formed in the via 36, the Sn-plated layer 56 is formed on the Au-plated layer 55, and the Au-plated layer 55 and the Sn-plated layer 56 formed in the via 36 are heated and melted at a temperature that is equal to or higher than a eutectic point (300° C. or higher in the present embodiment).

After the Au film 731 has been formed on the entire surface of the wafer 6 as illustrated in FIG. 22, a resist is applied to the entire surface of the wafer 6 so as to form a resist layer (not shown), and after the resist layer has been formed on the Au film 731, exposure and development are performed so as to form a preset pattern (the formation of the electrode pad 33, the electrode pattern 37, and the third bonding material 73). The Au film 731 that has been exposed by the exposure and development is then subjected to metal etching so as to form Au films 731 of the electrode pad 33, the electrode pattern 37, and the third bonding material 73. Thereafter, an Sn-plated layer and an Au-plated layer of the electrode pad 33 and an Sn-plated layer 732 and an Au-plated layer 733 of the third bonding material 73 are formed so that the electrode pad 33, the external electrode terminal 34, the electrode pattern 37, and the third bonding material 73 of the first sealing member 1 are formed as illustrated in FIG. 2.

Next, a method for manufacturing the crystal resonator 1 is described with reference to FIGS. 1 and 2. Note that the present embodiment describes such a manufacturing method in which a crystal resonator plate 2 as an individual piece is arranged on each of multiple first sealing members 3 formed on the wafer 6, and then a second sealing member 4 as an individual piece is further arranged thereon. The present invention is, however, not limited to the method described in the present embodiment; the method may be such that a crystal wafer with multiple crystal resonator plates 2 formed thereon is provided on a wafer of a quartz Z plate with multiple first sealing members 3 formed thereon, then a wafer of a quartz Z plate with multiple second sealing members 4 formed thereon is further provided thereon, and thereafter, the crystal resonator plates 2, the first sealing members 3, and the second sealing members 4 are bonded together and split into individual pieces. Such a method is suitable for the mass production of crystal resonators 1.

On one major surface 31 of each of multiple first sealing members 3 formed on the wafer 6 of a quartz Z plate with the above-described configuration, a crystal resonator plate 2 as an individual piece is arranged in a position that has been set by an image recognition means so that one major surface 21 of the crystal resonator plate 2 and one major surface 31 of the first sealing member 3 face each other.

After the crystal resonator plate 2 has been arranged on the first sealing member 3, a second sealing member 4 as an individual piece is arranged on one major surface 21 of the crystal resonator plate 2 in a position that has been set by the image recognition means so that one major surface 41 of the second sealing member 4 and the other major surface 22 of the crystal resonator plate 2 face each other; consequently, the crystal resonator plate 2, the first sealing members 3, and the second sealing member 4 are laminated one above another.

After the crystal resonator plate 2, the first sealing member 3, and the second sealing member 4 have been laminated one above another, temporary bonding is performed by the FCB method using ultrasound for the crystal resonator plate 2, the first sealing members 3, and the second sealing member 4.

After the temporary bonding of the crystal resonator plate 2, the first sealing member 3, and the second sealing member 4, other manufacturing steps (such as gas drainage from the internal space 12 and oscillation frequency control) are performed and heat/melt bonding is performed thereafter. Note that the manufacturing steps according to the present embodiment are performed in a vacuum atmosphere.

Note that the heat/melt bonding of the first bonding material 71 and the third bonding material 73 forms a bonding member 7, with which the crystal resonator plate 2 and the first sealing member 3 are bonded together. By bonding the crystal resonator plate 2 and the first sealing member 3 with the bonding material 7, the driving electrode 23 formed in the resonator region on one major surface 21 of the crystal resonator plate 2 is hermetically sealed as illustrated in FIG. 1.

Simultaneously with the bonding of the first bonding material 71 and the third bonding material 73, heat/melt bonding of the second bonding material 72 and the fourth bonding material 74 forms another bonding material 7, with which the crystal resonator plate 2 and the second sealing member 4 are bonded together. By bonding the crystal resonator plate 2 and the second sealing member 4 with the bonding material 7, the driving electrode 23 formed in the resonator region on the other major surface 22 of the crystal resonator plate 2 is hermetically sealed as illustrated in FIG. 1.

As described above, with the crystal resonator 1 and the first sealing member 3 and the method for manufacturing the first sealing member 3 according to the present embodiment, it is possible to provide stable conduction in the via 36 formed in the first sealing member 3.

Specifically, in the crystal resonator 1 and the first sealing member 3 according to the present embodiment, since the via 36 is formed so that the electrode pattern (the electrode pad 33, the external electrode terminal 34, and the electrode pattern 37) formed on the major surfaces 31 and 38 of the first sealing member 3 is brought into conduction; and the conductive member 5 fills in the via 36, the via 36 having a smaller diameter at a portion thereof in the interior 35 of the substrate than at both end portions 362 thereof at the major surfaces 31 and 38, both end faces 51 of the conductive member 5 having a concave shape with respect to the major surfaces 31 and 38 of the first sealing member 3, it is possible to reduce the aspect ratio of the via 36. As a result, it is possible to prevent the formation of voids when forming the conductive member 5 in the via 36. Moreover, since the via 36 has a smaller diameter at a portion thereof in the interior 35 of the substrate than at both end portions 362 thereof at the major surfaces 31 and 38, an anchor effect occurs when bonding the conductive member 5 into the via 36, which makes it possible to prevent the conductive member 5 from being delaminated from the inside of the via 36.

Still more, since the end faces 51 of the conductive member 5 have a concave shape with respect to the major surfaces 31 and 38 of the first sealing member 3, it is possible to avoid a short circuit due to possible contact of the conductive member with any other member such as the piezoelectric resonator plate 2.

Also, the end faces 51 of the conductive member 5 are made concave by the Au and Sn thereof being melted and diffused so as to be drawn in the direction along the plane of the major surfaces 31 and 38. Such drawing of Au and Sn provides good bonding between the first sealing member 3 and the conductive member 5 and prevents the formation of a clearance between the first sealing member 3 and the conductive member 5, thus preventing the leakage of filler, i.e., the conductive member 5 into the first sealing member 3. Moreover, such drawing of the conductive member 5 due to the melting and diffusion of Au and Sn relies largely on the surface tensions of Au and Sn, so the conductive member 5 is drawn by the surface tensions of Au and Sn in the direction toward the inside of the via 36. Thus, even if the conductive member 5 is formed in the first sealing member 3 with the Au and Sn thereof being dispersed in the via 36, the melting and diffusion of Au and Sn causes the conductive member 5 to be displaced inwardly in the via 36 and to thereby fill in the via 36. In other words, the melting and diffusion of Au and Sn enables correction of the position where the conductive member 5 fills in the via 36 of the first sealing member 3.

Also, since the inner side face 361 of the via 36 is tapered so that the via 36 has a smaller diameter at a midpoint 39 thereof in the direction along the substrate thickness than at both end portions 362 thereof at the major surfaces 31 and 38, an anchor effect is likely to occur when bonding the conductive member 5 into the via 36.

Also, the uneven distribution of Au in an area where the via 36 has a narrow diameter provides good conduction in the via 36.

Also, since the method for manufacturing the first sealing member 3 according to an embodiment of the present invention includes a formation step and a filling step, wherein in the formation step, the via 36 is formed by etching the first sealing member 3 simultaneously from both of the major surfaces 31 and 38 of the first sealing member 3, using an etching technique, so that the via 36 has a smaller diameter at a portion thereof in the interior 35 of the substrate than at both end portions 362 thereof at the major surfaces 31 and 38, and the end faces 51 of the conductive member 5 have a concave shape with respect to the major surfaces 31 and 38 of the first sealing member 3, it is possible to reduce the aspect ratio of the via 36. As a result, it is possible to prevent the formation of voids when forming the conductive member 5 in the via 36. Moreover, since the via 36 has a smaller diameter at a portion thereof in the interior 35 of the substrate than at both end portions 362 thereof at the major surfaces 31 and 38, an anchor effect occurs when bonding the conductive member 5 into the via 36, which makes it possible to prevent the conductive member 5 from being delaminated from the inside of the via 36.

Still more, since the end faces 51 of the conductive member 5 have a concave shape with respect to the major surfaces 31 and 38 of the first sealing member 3, it is possible to avoid a short circuit due to possible contact of the conductive member with any other member such as the crystal resonator plate 2.

Also, in the filling step, since the Au-plated layer 55 is formed in the via 36, the Sn-plated layer 56 is formed on the Au-plated layer 55, and the Au-plated layer 55 and the Sn-plated layer 56 formed in the via 36 are heated and melted at a temperature that is equal to or higher than a eutectic point, it is possible to prevent the formation of voids in the conductive member 5 during the step of filling with the conductive member 5.

Note that, in the present embodiment, while only the first sealing member 3 is employed as a sealing member, the present invention is not limited thereto; the second sealing member 4 with a via 36 formed therein may be employed as a sealing member. As another alternative, both of the first sealing member 3 and the second sealing member 4 may be employed as sealing members.

Also, in the present embodiment, while the conductive member 5 that fills in the via 36 includes the Au-plated layer 55 and the Sn-plated layer 56, its configuration is not limited to a plated layer; it may be a film or may be of any other configuration.

Also, in the present embodiment, while the Au-plated layer 55 is formed in the via 36 and the Sn-plated layer 56 is formed on the Au-plated layer 55 in the filling step (see FIGS. 14 to 20), the positions where the Au-plated layer 55 and the Sn-plated layer 56 are formed do not necessarily extend to the major surfaces 61 and 62 of the wafer 6 (the major surfaces 31 and 38 of the first sealing member 3) as long as they are formed within the via 36. In other words, the outer edges of the Au-plated layer 55 and the Sn-plated layer 56, as viewed in plane, may be on the inner side face 361 of the via 36. In this case, the conductive member 5 is formed inside the via 36 in the filling step and is not formed on the major surfaces 31 and 38 of the first sealing member 3. Forming the conductive member 5 only within the via 36 in this way prevents the conductive member 5 from protruding from the major surfaces 31 and 38 of the first sealing member 3. This consequently prevents any protrusion of the conductive member 5 from being in contact with the crystal resonator plate 2 when bonding the crystal resonator plate 2 to the first sealing member 3, thus preventing the occurrence of bonding failure due to the concentration of a load on any protrusion of the conductive member 5 during bonding.

Also, in the present embodiment, while the Au-plated layer 55 and the Sn-plated layer 56 formed in the via 36 are heated and melted so as to form the conductive member 5 of an Au-rich Au—Sn compound that contains the intermetallic compound 52 of Au and Sn located within the via 36 in the vicinity of the major surfaces 31 and 38 of the first sealing member 3 and Au 53 located at the midpoint 39 in the direction along the thickness of the first sealing member 3, the conductive member 5 may be configured through any other manufacturing steps. For example, an Au—Sn alloy plated layer may be formed in the via 36 prior to heat-melting, i.e., a conductive member 5 of a compound may be used from the beginning. Specifically, the filling step may be such that an Au—Sn alloy plated layer is formed within the via 36 and then heated and melted at a temperature that is equal to or higher than a eutectic point. In this way, if the conductive member 5 is formed of an Au—Sn alloy, the melting time is short because an alloy is already there (prior to the formation of the conductive member 5), which further prevents the formation of voids.

Also, in the present embodiment, while the conductive member 5 is an Au-rich Au—Sn compound that contains the intermetallic compound 52 of Au and Sn located within the via 36 in the vicinity of the major surfaces 31 and 38 of the first sealing member 3 and Au 53 located at the midpoint 3 in the direction along the thickness of the first sealing member 3, this is merely one preferable example that provides improved conduction; alternatively, a conductive member 5 that contains only the Au—Sn intermetallic compound 52, for example, can also achieve the effect of providing stable conduction.

Also, in the present embodiment, while the first sealing member 3 is a quartz crystal Z plate, the present invention is not limited thereto; the first sealing member 3 may be any other quartz crystal or may be a glass, for example.

Also, in the present embodiment, while Cr, Au, and Sn are used as the bonding material 7, the present invention is not limited thereto. The bonding material 7 may be formed of, for example, Cr, Au, and Ge as long as it includes at least a chief material (Au in the present embodiment); an auxiliary material (Cr in the present embodiment) that improves the bonding of the crystal resonator plate 2, the first sealing member 3, and the second sealing member 4 with the chief material; and a reinforcing material (Sn in the present embodiment) that causes diffusion bonding with the chief material.

Also, in the present embodiment, while the bonding region (specifically, a sealed path) of the first bonding material 71 on the bonding surface 25 of the crystal resonator plate 2 and the bonding region (specifically, a sealed path) of the third bonding material 73 on the bonding surface 32 of the first sealing member 3 have the same width and the bonding region (specifically, a sealed path) of the second bonding material 72 on the bonding surface 25 of the crystal resonator plate 2 and the bonding region (specifically, a sealed path) of the fourth bonding material 74 on the bonding surface 42 of the second sealing member 4 have the same width, the present invention is not limited thereto. For example, the bonding region (specifically, a sealed path) of the first bonding material 71 on the bonding surface 25 of the crystal resonator plate 2 may have a greater width than the bonding region (specifically, a sealed path) of the third bonding material 73 on the bonding surface 32 of the first sealing member 3; and the bonding region (specifically, a sealed path) of the second bonding material 72 on the bonding surface 25 of the crystal resonator plate 2 may have a greater width than the bonding region (specifically, a sealed path) of the fourth bonding material 74 on the bonding surface 42 of the second sealing member 4.

In this case, since the bonding regions of the first bonding material 71 and the second bonding material 72 on the bonding surface 25 of the crystal resonator plate 2 have greater widths than the bonding region of the third bonding material 73 on the bonding surface 32 of the first sealing member 3 and the bonding region of the fourth bonding material 74 on the bonding surface 42 of the second sealing member 4, the third bonding material 73 and the fourth bonding material 74 are drawn to the wider bonding regions of the first bonding material 71 and the second bonding material 72 during bonding of the crystal resonator plate 2, the first sealing member 3, and the second sealing member 4. This phenomenon is caused by the use of Sn for the third bonding material 73 and the fourth bonding material 74, i.e., by Sn being drawn by Au of the first bonding material 71 and the second bonding material 72. By making use of this phenomenon, it is possible to prevent the bonding materials 7 from being squeezed out of the end face of the crystal resonator 1.

Also, in the present embodiment, while the first sealing member 3 is provided with, as illustrated in FIGS. 1 and 2, the electrode pad 33 that is electrically connected to the driving electrodes 23 of the crystal resonator plate 2, the bonding portion that is bonded to the crystal resonator plate 2 (specifically, the bonding surface 32), and the external electrode terminal 34 that is electrically connected to the outside, the materials for those components are not limited to those described. The materials may, for example, be those illustrated in FIGS. 23 and 24 as long as the electrode pad 33 can electrically be connected to the driving electrodes 23 of the crystal resonator plate 2, the bonding portion can be bonded to the crystal resonator plate 2, and the external electrode terminal 34 can electrically be connected to the outside.

Figure 23:
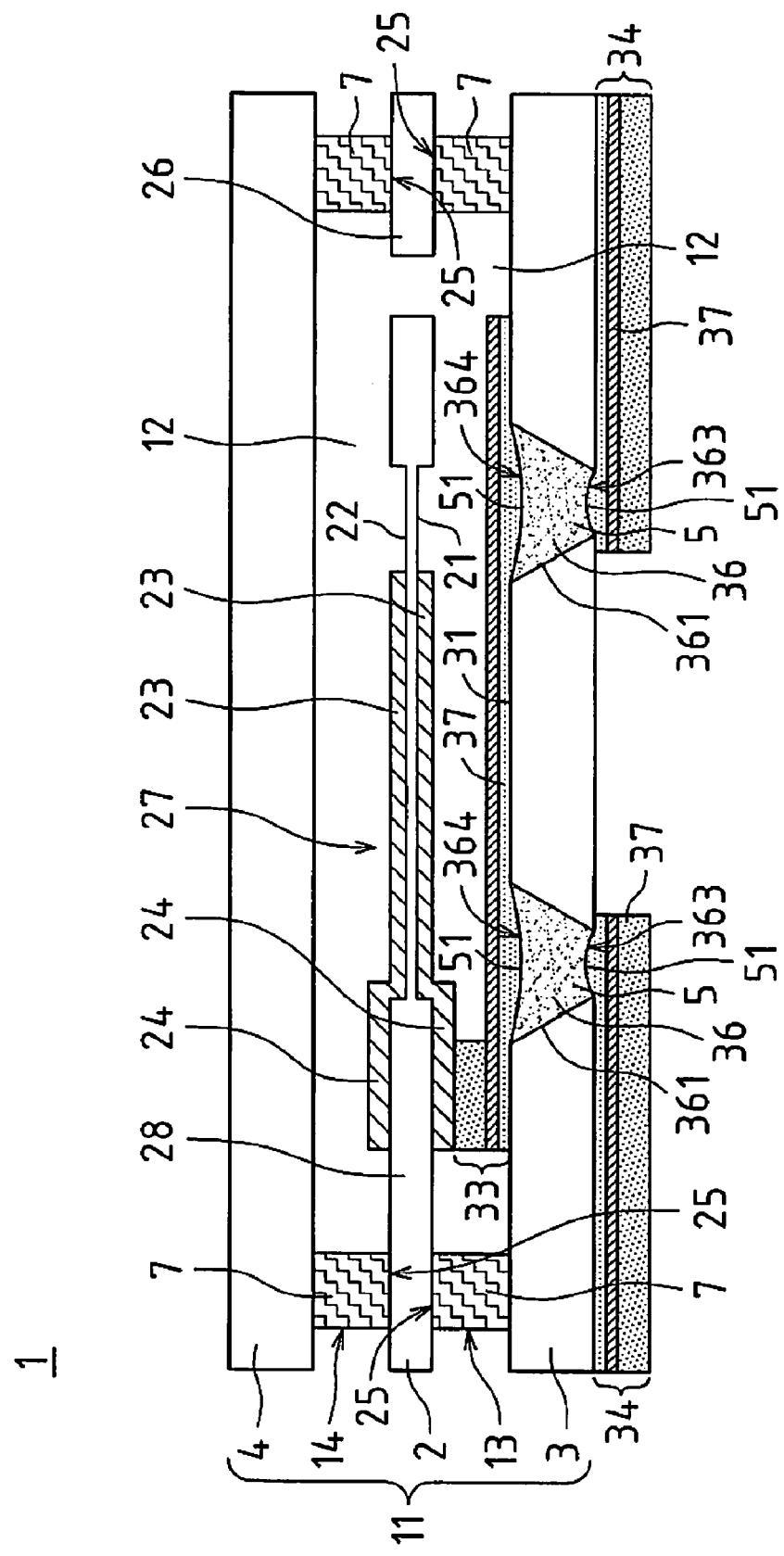
FIG. 23 is a schematic side view showing an internal space of a crystal resonator according to another embodiment of the present invention.
Figure 24:
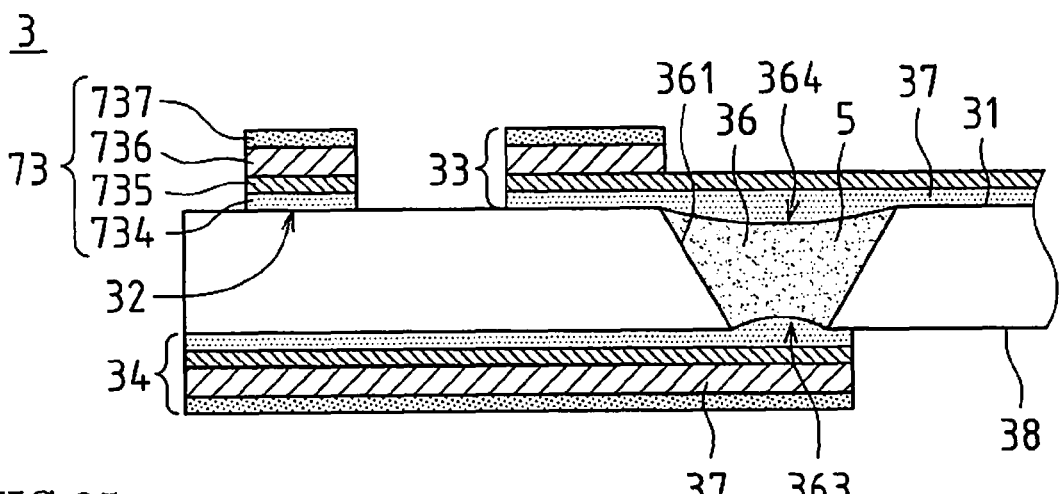
FIG. 24 is a schematic block diagram illustrating an enlarged via portion of the first sealing member as an independent unit illustrated in FIG. 23.

Also, in the present embodiment, while the first sealing member 3 has formed therein the via 36 so that the driving electrodes 23 of the crystal resonator plate 2 are brought into conduction with the outside as illustrated in FIGS. 1 and 2, the shape of the via 36 is not limited thereto; the via 36 may, for example, be of the shape illustrated in FIGS. 23 and 24 as long as it is possible to provide stable conduction in the via 36 formed in the first sealing member 3.

FIG. 24 is a schematic block diagram illustrating an enlarged portion around the via 36 of the first sealing member 3, assuming that the crystal resonator plate 2, the first sealing member 3, and the second sealing member 4 are not bonded together and each are configured as an independent component. FIG. 23 is a schematic side view showing an internal space of the crystal resonator 1 that is produced by bonding the crystal resonator plate 2, the first sealing member 3 illustrated in FIG. 24, and the second sealing member 4.

The first sealing member 3 has formed on a bonding surface 32 thereof a third bonding material 73 for bonding the crystal resonator plate 2, as illustrated in FIG. 24. Specifically, the third bonding material 73 is configured by laminating multiple layers; when viewed from the bottom layer side, forming a Cr—Au layer 734 by evaporation, laminating thereon a Ni-plated layer of Ni (a diffusion preventing layer that prevents metal from diffusing, according to the present invention) 735, and then laminating thereon Au strike plating 736 and an Au-plated layer 737. An electrode pattern 37 is formed from the Cr—Au layer 734 and the Ni-plated layer, and an electrode pad 33 is formed from the Au strike plating 736 and the Au-plated layer 737. Note that the third bonding material 73, the electrode pad 33, and the external electrode terminal 34 are formed at the same time so that the electrode pad 33 has the same configuration as the third bonding material 73.

In the first sealing member 3, as illustrated in FIG. 24, a via 36 is formed, using an arbitrary etching technique such as wet etching or dry etching, so that the driving electrodes 23 of the crystal resonator plate 2 are brought into conduction with the outside; and a conductive member 5 fills in the via 36. Note that the via 36 illustrated in FIG. 24 is formed by one-side etching, i.e. etching the first sealing member 3 from only one major surface 31.

This via 36 is so configured that an electrode pattern (the electrode pad 33, the external electrode terminal 34, and the electrode pattern 37) formed on the major surfaces 31 and 38 of the substrate of the first sealing member 3 is brought into conduction. Through the via 36, the electrode pattern 37 is formed from the electrode pad 33 on one major surface 31 of the first sealing member 3 to the external electrode terminal 34 on the other major surface 38.

The via 36 has a smaller diameter at one end face 363 thereof than at the other end face 364 thereof at the major surfaces 31 and 38 of the substrate of the first sealing member 3, as illustrated in FIGS. 23 and 24. Also, as illustrated in FIGS. 23 and 24, an inner side face 361 of the via 36 is tapered; the inner side face 361 of the via 36 is tilted at approximately 60 degrees relative to the major surface 38 of the first sealing member 3.

The via 36 is filled with a conductive member 5 that contains at least an Au—Sn alloy formed by the above-described method for manufacturing the first sealing member 3.

Both end faces 51 of the conductive member 5 have a concave shape with respect to the major surfaces 31 and 38 of the first sealing member 3. The end faces 51 of the conductive member 5 are made concave by the Au and Sn thereof being melted and diffused so as to be drawn in the direction along the plane of the major surfaces 31 and 38. Such drawing of Au and Sn provides good bonding between the first sealing member 3 and the conductive member 5 and prevents the formation of a clearance between the first sealing member 3 and the conductive member 5, thus preventing the leakage of filler, i.e., the conductive member 5 into the first sealing member 3. Note that the conductive member 5 is configured to provide stable conduction, with Au being unevenly distributed at the end face 363 of the via 36 where the via 36 has a narrow diameter.

According to the embodiment illustrated in FIGS. 23 and 24, since the via 36 is formed so that the electrode pattern (the electrode pad 33, the external electrode terminal 34, and the electrode pattern 37) formed on the major surfaces 31 and 38 of the first sealing member 3 is brought into conduction; and the conductive member 5 fills in the via 36, the via 36 having a smaller diameter at the end face 363 thereof than at the end face 364 thereof at the major surfaces 31 and 38, the end faces 51 of the conductive member 5 having a concave shape with respect to the major surfaces 31 and 38 of the first sealing member 3, it is possible to reduce the aspect ratio of the via 36 and prevent the formation of voids when forming the conductive member 5 in the via 36. As a result, it is possible to provide stable conduction in the via 36 formed in the first sealing member 3.

Also, since the end faces 51 of the conductive member 5 have a concave shape with respect to the major surfaces 31 and 38 of the first sealing member 3, it is possible to avoid a short circuit due to possible contact of the conductive member with any other member such as the crystal resonator plate 2t.

Also, since the via 36 has a smaller diameter at the end face 363 thereof than at the end face 364 thereof at the major surfaces 31 and 38 of the substrate of the first sealing member 3, an anchor effect occurs when bonding the conductive member 5 into the via 36, which makes it possible to prevent the conductive member 5 from being delaminated from the inside of the via 36.

Also, since the inner side face 361 of the via 36 is tapered so as to be tiled at approximately 60 degrees with respect to the major surface of the substrate of the first sealing member 3, this is preferable to provide stable conduction in the via 36 formed in the first sealing member 3.

Also, since the Ni-plated layer 735 is included in the electrode pad 33, the external electrode terminal 34, and the electrode pattern 37, even if self-annealing of the conductive member is caused by any change with time or any thermal change, the presence of the Ni-plated layer 735 prevents the conductive member 5 (particularly Sn in the present embodiment) from diffusing into the electrode pattern 37 or the electrode pad 33.

Note that, in the present embodiment, while the Ni-plated layer 735 is taken as a specific example of a diffusion preventing layer, the present invention is not limited thereto; the diffusion preventing layer may be any other layer (film) of a material, such as Mo, W, or Ti, other than the Ni-plated layer 735. Efficient film formation is possible if a technique such as sputtering is used as a method for forming such a diffusion preventing layer. As a specific example, the diffusion preventing layer may preferably have a film thickness of approximately 0.1 to 0.5 µm. Also, in the present embodiment, since a crystal Z plate that has a thermal expansion coefficient close to that of a glass material is selected as a substrate of the first sealing member 3, it contributes to an improvement in reliability after film formation of the diffusion preventing layer.

Figure 25:
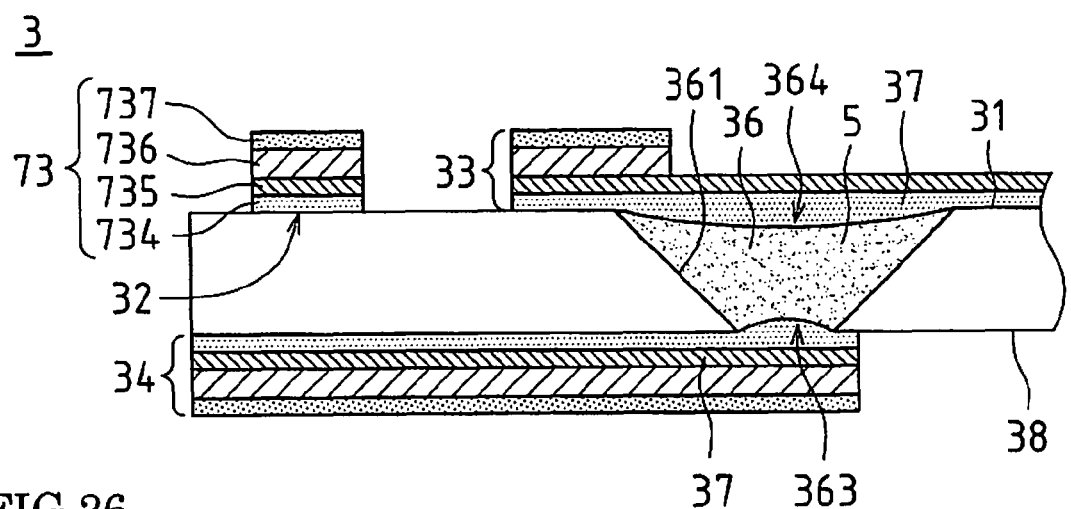
FIG. 25 is a schematic block diagram illustrating a case where the inner side face of the via of the first sealing member illustrated in FIG. 24 is tilted at approximately 45 degrees relative to a major surface.
Figure 26:
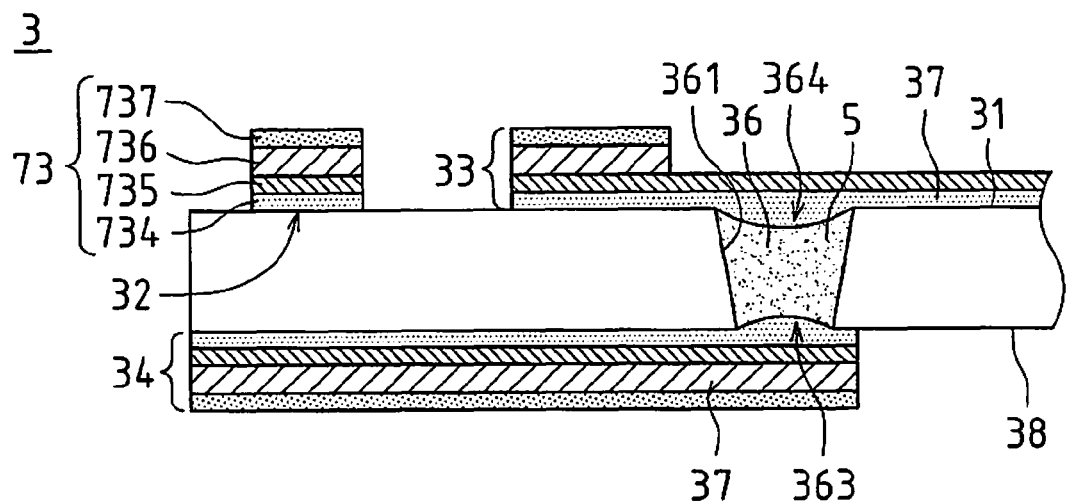
FIG. 26 is a schematic block diagram illustrating a case where the inner side face of the via of the first sealing member illustrated in FIG. 24 is tilted at approximately 85 degrees relative to a major surface.

Also, in the embodiment illustrated in FIGS. 23 and 24, while the inner side face 361 of the via 36 is tilted at approximately 60 degrees relative to the major surface of the substrate of the first sealing member 3, the tilt angle is not limited thereto as long as the inner side face 361 of the via 36 is tilted relative to the major surface of the substrate of the first sealing member 3; in particular, the tile angle may preferably be in the range of approximately 45 to 85 degrees FIG. 25 illustrates an embodiment where the tile angle is approximately 45 degrees, and FIG. 26 illustrates an embodiment where the tilt angle is approximately 85 degrees.

Figure 27:
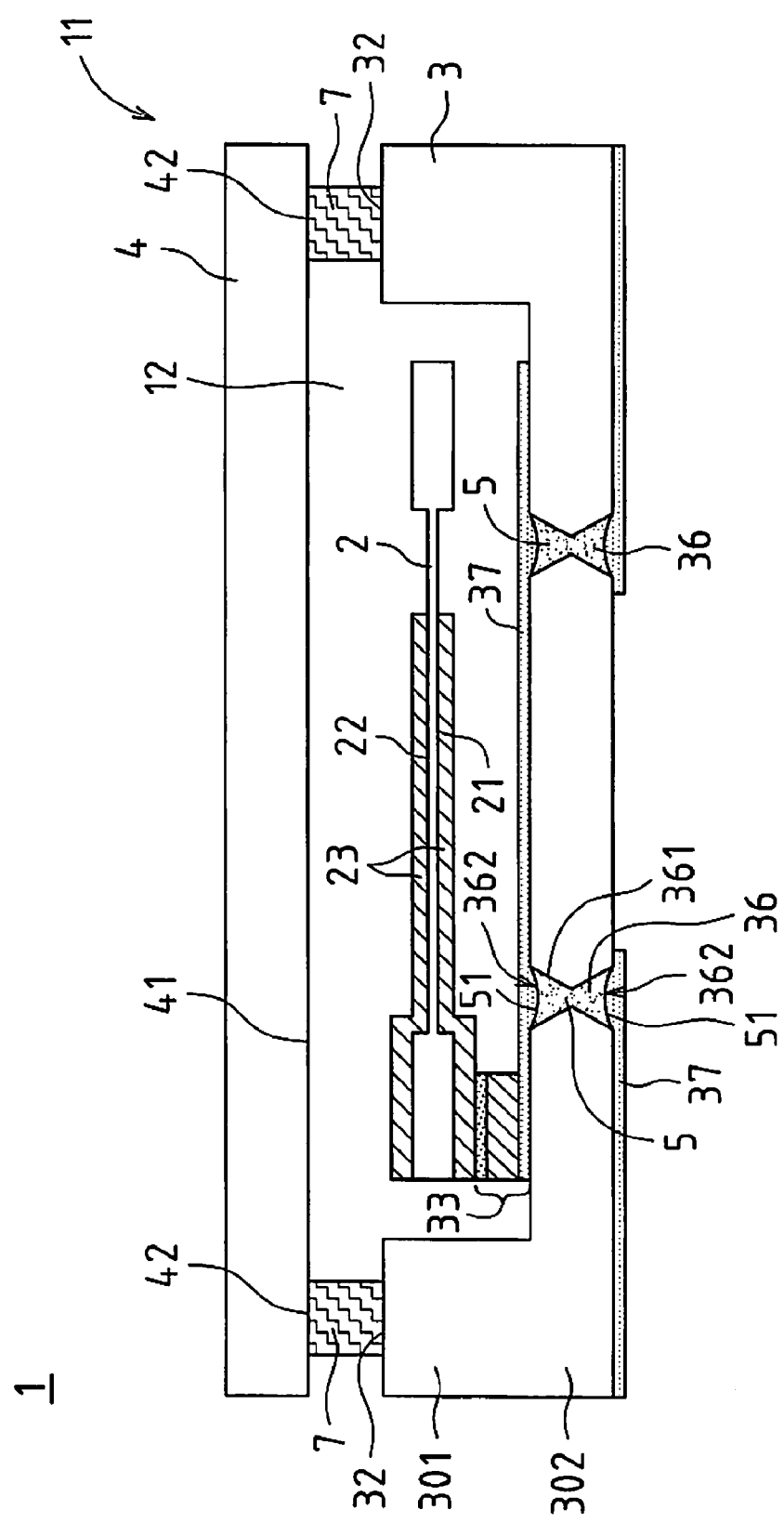
FIG. 27 is a schematic side view showing an internal space of a crystal resonator according to still another embodiment of the present invention.

Also, in the above-described embodiment illustrated in FIG. 1, while the configuration is such that the crystal resonator plate 2 and the first sealing member 3 are bonded together with a bonding material 7 and the crystal resonator plate 2 and the second sealing member 4 are bonded together with another bonding material 7, the present invention is not limited thereto. As illustrated in FIG. 27, a crystal resonator plate 2 may be mounted on a packaged first sealing member 3, and the first sealing member 3 may be bonded to a second sealing member 4 with a bonding material 7 so as to hermetically seal driving electrodes 23 of the crystal resonator plate 2. Even in such a case, the same function and effect as described above with reference to FIG. 1 can be achieved.

To be more specific, a packaged-type crystal resonator 1 illustrated in FIG. 27 includes a crystal resonator plate 2 made of a piezoelectric material and having driving electrodes 23 formed on both major surfaces 21 and 22 thereof a first sealing member 3 with the crystal resonator plate 2 mounted thereon, and a second sealing member 4 that is bonded to the first sealing member 3 with a bonding material 7 so as to hermetically seal the driving electrodes 23 of the crystal resonator plate 2.

The first sealing member 3 is, as illustrated in FIG. 27, a glass base of a box-like body shape that has a bottom face 302 and a bank portion 301 extending upward from the bottom face 302. A top surface of the bank portion 301 of the first sealing member 3 forms a bonding surface 32, which is formed into a flat smooth surface (by mirror finishing). The first sealing member 3 has formed on the bonding surface 32 thereof a part of the bonding material 7 for bonding the second sealing member 4. Note that such a part of the bonding material is configured by laminating multiple layers on the bonding surface 32 of the bank portion 301; when viewed from the bottom layer side, forming a Cr layer (not shown) and an Au layer (not shown) by evaporation and laminating thereon an Au-plated layer (not shown).

The second sealing member 4 is, as illustrated in FIG. 27, a lid that is a substrate of a rectangular parallelepiped shape formed from a single glass wafer. One major surface 41 of the second sealing member 4 forms a bonding surface 42, which is formed into a flat smooth surface (by mirror finishing). The second sealing member 4 has the other part of the bonding material 7 for bonding the first sealing member 3, formed on the outer periphery of one major surface 41 of the second sealing member 4 as viewed in plane. Note that the other part of the bonding material 7 is configured by laminating multiple layers on the bonding surface 42; when viewed from the bottom layer side, forming a Cr layer (not shown) and an Au layer (not shown) by evaporation, laminating thereon an Au—Sn alloy layer (not shown), and laminating thereon an Au flash plated layer (not shown). As another alternative, the other part of the bonding material 7 may be configured by forming a Cr layer and an Au layer by evaporation from the bottom surface side and laminating thereon an Sn-plated layer and an Au-plated layer in this order.

In the crystal resonator 1 illustrated in FIG. 27, the bonding material 7 is configured by bonding one and the other parts of the bonding material 7. The crystal resonator 1 has a single internal space 12 formed in a package 11 thereof by bonding the first sealing member 3 and the second sealing member 4 together with the bonding material 7; and the driving electrodes 23 formed on major surfaces 21 and 22 of the crystal resonator plate 2 are hermetically sealed in this internal space 12 of the package 11.

Figure 28:
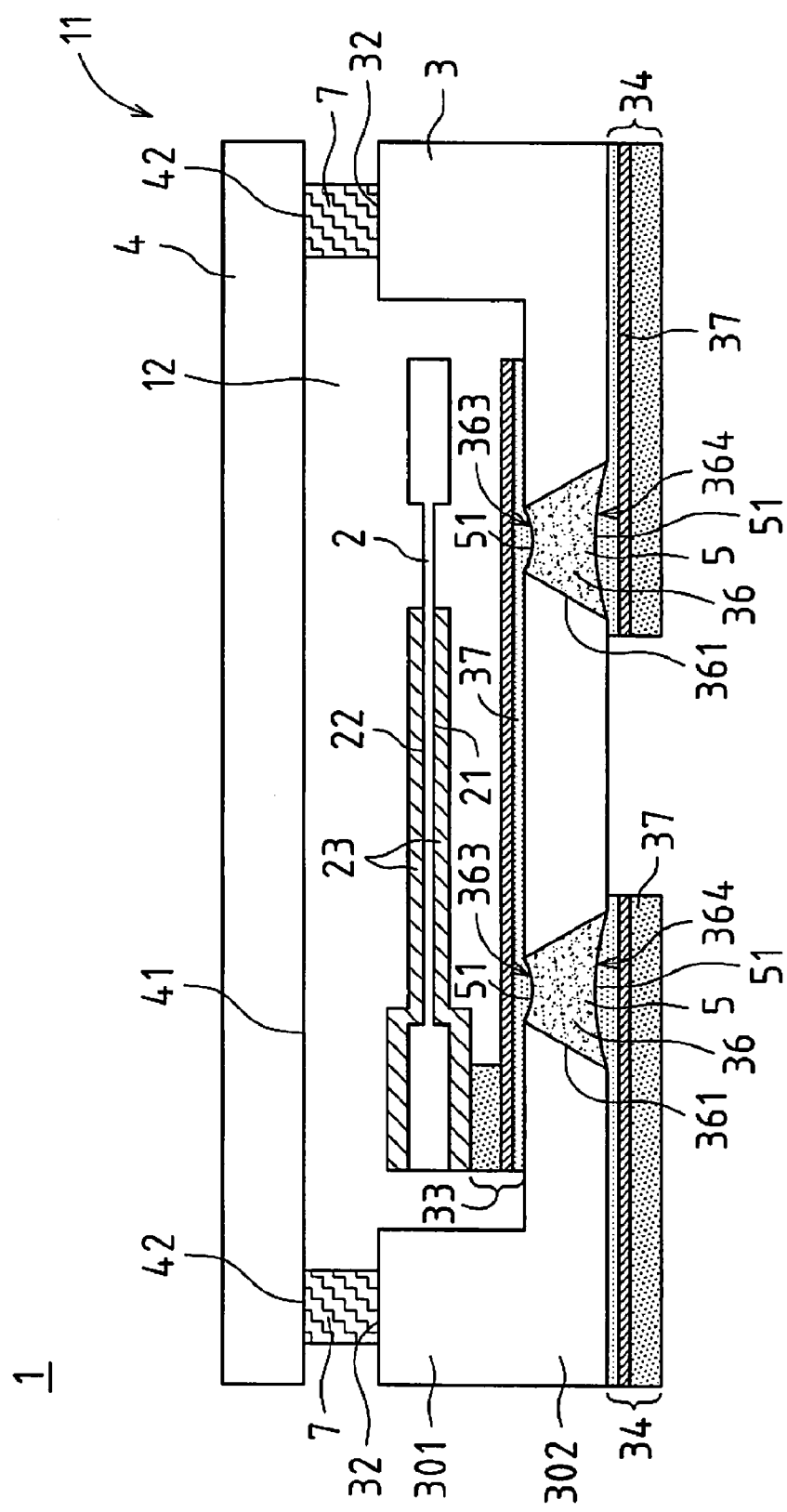
FIG. 28 is a schematic side view showing an internal space of a crystal resonator according to still another embodiment of the present invention.

Note that, while the above-described embodiment illustrated in FIG. 27 adopts the components of the first sealing member 3 according to the embodiment illustrated in FIG. 1, it may adopt the components of the first sealing member 3 according to the embodiment illustrated FIG. 23. Specifically, FIG. 28 illustrates a packaged-type crystal resonator 1 that adopts the components of the first sealing member 3 according to the embodiment illustrated in FIG. 23. The crystal resonator 1 differs from the embodiment illustrated in FIG. 27 only in the electrode pattern (the electrode pad 33, the external electrode terminal 34, and the electrode pattern 37) and the via 36, and its other components are identical to those in FIG. 27. Also, the electrode pattern has a similar configuration to that of the crystal resonator 1 illustrated in FIG. 23. Thus, the electrode pattern of the crystal resonator 1 is not described herein. The via 36 has a configuration that is upside down compared to the configuration illustrated in FIG. 23. Specifically, the end face 364 of the via 36 is formed at the major surface 38 of the first sealing member 3 and the end face 363 of the via 36 is formed at the major surface 31 of the first sealing member 3, with an opening of the via 6 being gradually widened from one major surface 31 of the first sealing member 3 toward the other major surface 38. The via 36 illustrated in FIG. 28 has the same function as the via 36 illustrated in FIG. 23. The configuration illustrated in FIG. 28 is preferable in the case where the internal space 12 and the via 36 are formed simultaneously by etching. The crystal resonator 1 with the above-described configuration illustrated in FIG. 28 has the same function and effect as those achieved by the first sealing members 3 of the crystal resonators 1 illustrated in FIGS. 1, 23 and 27.

Figure 29:
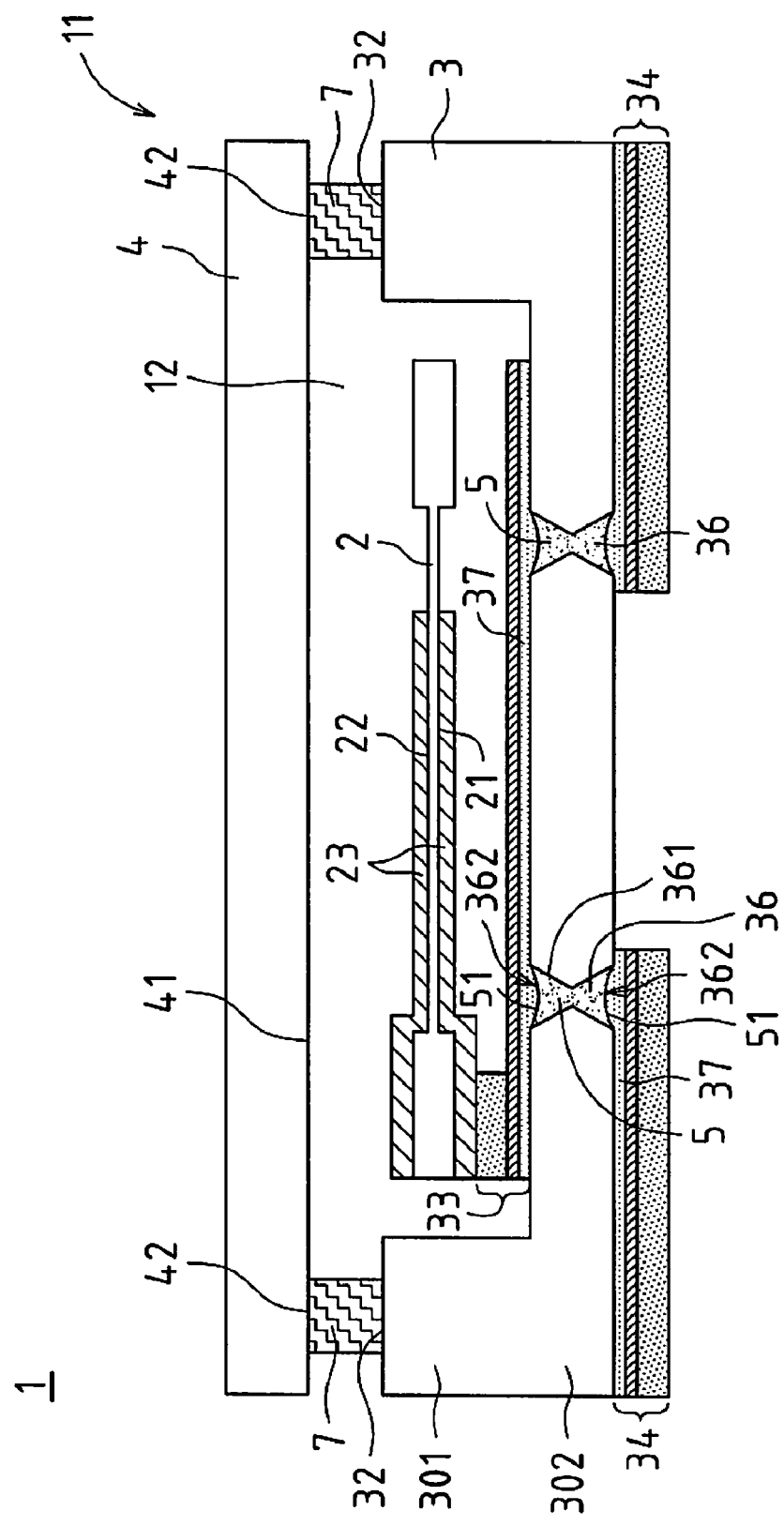
FIG. 29 is a schematic side view showing an internal space of a crystal resonator according to still another embodiment of the present invention.

Also, while the electrode patterns in the embodiments illustrated in FIGS. 23 and 28 include the Ni-plated layer 735, a configuration including the Ni-plated layer 735 is not limited thereto; the electrode pattern in the embodiment illustrated in FIG. 1 or 27 may also include the Ni-plated layer 735; for example, a configuration illustrated in FIG. 29 is also possible. A crystal resonator 1 illustrated in FIG. 29 is configured by adopting the electrode pattern (the electrode pad 33, the external electrode terminal 34, and the electrode pattern 37) and the via 36 illustrated in FIG. 28 to the crystal resonator 1 illustrated in FIG. 27. Thus, the components of the crystal resonator 1 illustrated in FIG. 29 are not described herein.

Also, in the present embodiment, while the Ni-plated layer 735 is used as a diffusion preventing layer, this is merely a preferable example and the present invention is not limited thereto; the diffusion preventing layer may be of any other material as long as it can prevent the material (Sn in the above-described embodiment) of the conductive member 5 from diffusing.

It should be noted that the present invention can be implemented in a variety of other forms without departing from the spirit, gist or main features thereof. For this reason, the above-described embodiments are to all intents and purposes merely illustrative and should not be construed as limiting. The scope of the present invention is indicated by the claims and is not in any way restricted by the text of the Detailed Description. Furthermore, all variations and modifications of the claims within the scope of equivalency fall within the purview of the present invention.

In addition, this Application claims priority rights from Japanese Patent Application No. 2008-201882 filed on Aug. 5, 2008 in Japan. Its entire contents are incorporated in this Application by reference.

INDUSTRIAL APPLICABILITY

The present invention is applicable to a piezoelectric resonator device that uses a crystal for a sealing member and a method for manufacturing such a sealing member.

The invention claimed is:
1. A sealing member of a piezoelectric resonator device that hermetically seals a driving electrode formed on a piezoelectric resonator plate, wherein
    a through hole is formed so that an electrode pattern formed on both major surfaces of a substrate of the sealing member is brought into conduction, and a conductive member fills in the through hole,
    the through hole having a smaller diameter at a portion thereof inside the substrate than at both end portions thereof at the major surfaces of the substrate,
    both end faces of the conductive member having a concave shape with respect to the major surfaces of the substrate, and wherein
    the conductive member is a compound that contains at least Au and Sn, and Au is unevenly distributed in an area of the through hole inside the substrate where the through hole has a small diameter.
2. The sealing member of a piezoelectric resonator device according to claim 1, wherein
    an inner side face of the through hole is tapered, and
    the through hole has a smaller diameter at a midpoint thereof in a direction along a substrate thickness than at both end portions thereof at the major surfaces.
3. The sealing member of a piezoelectric resonator device according to claim 1, wherein the electrode pattern includes a diffusion preventing layer that prevents metal from diffusing.

* * * * *